United States Patent
Kuh et al.

(10) Patent No.: US 9,728,666 B2
(45) Date of Patent: Aug. 8, 2017

(54) SEMICONDUCTOR DEVICE AND METHOD FOR FABRICATING THE SAME

(71) Applicant: Samsung Electronics Co., Ltd., Suwon-si (KR)

(72) Inventors: Bongjin Kuh, Suwon-si (KR); Kichul Kim, Seongnam-si (KR); JeongMeung Kim, Seoul (KR); Joonghan Shin, Seoul (KR); Jongsung Lim, Seoul (KR); Hanmei Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 352 days.

(21) Appl. No.: 14/141,547

(22) Filed: Dec. 27, 2013

(65) Prior Publication Data

US 2014/0353713 A1    Dec. 4, 2014

(30) Foreign Application Priority Data

Jun. 3, 2013 (KR) .......................... 10-2013-0063293

(51) Int. Cl.
```
H01L 31/0248    (2006.01)
H01L 31/105     (2006.01)
H01L 31/0224    (2006.01)
H01L 31/0232    (2014.01)
H01L 31/0352    (2006.01)
H01L 31/18      (2006.01)
```

(52) U.S. Cl.
CPC ...... *H01L 31/105* (2013.01); *H01L 31/02327* (2013.01); *H01L 31/022408* (2013.01); *H01L 31/03529* (2013.01); *H01L 31/1808* (2013.01); *H01L 31/1872* (2013.01); *Y02E 10/50* (2013.01); *Y02P 70/521* (2015.11)

(58) Field of Classification Search
None
See application file for complete search history.

(56) References Cited

U.S. PATENT DOCUMENTS

| | | |
|---|---|---|
| 7,271,023 B2 | 9/2007 | Lee et al. |
| 8,216,951 B2 | 7/2012 | Cheng et al. |
| 8,247,313 B2 | 8/2012 | Vincent et al. |

(Continued)

FOREIGN PATENT DOCUMENTS

KR    10-2006-0075953 A    7/2006

OTHER PUBLICATIONS

Ang et al., "Germanium Photodetector Technologies for Optical Communication Applications", Semiconductor Technologies, Jan Grym (Ed.), InTech Publishing, Apr. 1, 2010, pp. 373-406.

A.J. Birnbaum et al., "On the Lateral Crystal Growth of Laser Irradiated NiTi Thin Films", Applied Physics Letters, 2009, pp. 1-10.

(Continued)

*Primary Examiner* — Abul Kalam
(74) *Attorney, Agent, or Firm* — Muir Patent Law, PLLC

(57) ABSTRACT

A semiconductor device includes a substrate, a first insulation layer formed on the substrate in a first region, a photon absorption seed layer formed on the first insulation layer in the first region and on the substrate in a second region separate from the first region, and a photon absorption layer formed on the photon absorption seed layer in the first region. The photon absorption seed layer has a particular structure that may assist in reducing dislocation density in a region that includes a photon absorption layer.

36 Claims, 16 Drawing Sheets

(56) References Cited

U.S. PATENT DOCUMENTS

| | | |
|---|---|---|
| 8,263,474 B2 | 9/2012 | Dip et al. |
| 8,269,254 B2 | 9/2012 | Ahn et al. |
| 8,299,500 B2 | 10/2012 | Hodge et al. |
| 8,324,660 B2 | 12/2012 | Lochtefeld et al. |
| 2011/0012221 A1* | 1/2011 | Fujikata ............ G02B 6/12004 257/458 |
| 2011/0049568 A1* | 3/2011 | Lochtefeld ........ H01L 21/02381 257/190 |
| 2011/0147870 A1* | 6/2011 | Ang ........................ H01L 21/84 257/432 |
| 2014/0091374 A1* | 4/2014 | Assefa ................ H01L 27/1443 257/290 |
| 2014/0185981 A1* | 7/2014 | Assefa ................ G06F 17/5068 385/14 |
| 2014/0197507 A1* | 7/2014 | Assefa ............. H01L 31/02327 257/432 |
| 2014/0312443 A1* | 10/2014 | Assefa .................... G02B 6/13 257/432 |
| 2015/0016769 A1* | 1/2015 | Verma ................ G02B 6/12004 385/14 |

OTHER PUBLICATIONS

Ning-Ning Feng et al., "Vertical p-i-n germanium photodetector with high external responsivity integrated with large core Si waveguides", Optical Society of America, vol. 18, No. 1 / Optics Express, 96~101, Jan. 4, 2010.

R. James Kirkpatrick, "Crystal Growth from the Melt: A Review", Hoffman Laboratory, Harvard University, American Mineralogist, vol. 60, 1975, pp. 798-814.

Mutsuko Hatano et al., "Excimer Laser-Induced Melting and Resolidification Dynamics of Silicon Thin Films", Journal of the Korean Physical Society, vol. 39, Dec. 2001, pp. S419-S424.

Kasper et al., "Silicon Quantum Integrated Circuits", New York: Springer.

Jia Feng et al., "High-Performance Gate-All-Around GeOI p-MOSFETs Fabricated by Rapid Melt Growth Using Plasma Nitridation and ALD Al2O3 Gate Dielectric and Self-Aligned NiGe Contacts", IEEE Electron Device Letters, vol. 29, No. 7, Jul. 2008, pp. 805-807.

Yaocheng Liu et al., "Rapid Melt Growth of Germanium Crystals with Self-Aligned Microcrucibles on Si Substrates", Journal of The Electrochemical Society, 152 (8) G688-G693 (2005).

* cited by examiner

SEMICONDUCTOR DEVICE AND METHOD FOR FABRICATING THE SAME

CROSS-REFERENCE TO RELATED APPLICATIONS

This U.S. non-provisional patent application claims priority under 35 U.S.C. §119 to Korean Patent Application No. 10-2013-0063293, filed on Jun. 3, 2013, in the Korean Intellectual Property Office, the entire contents of which are hereby incorporated by reference.

BACKGROUND OF THE INVENTION

This disclosure relates to a semiconductor device, and in particular, to a semiconductor device with an epitaxial layer and a method of fabricating the same.

Due to their small-size, multifunctionality, and/or low-cost characteristics, semiconductor devices are considered important elements in the electronic industry. Various semiconductor materials are being used for realizing the semiconductor devices. For example, silicon is widely used as a basic material for the semiconductor industry, due to its economic value and excellent properties. However, there is a need to use other semiconductor materials along with the use of silicon. An epitaxial growth process may be used to form certain semiconductor layers. This often results in certain defects occurring at interfaces between layers made of different materials. Therefore, a method capable of forming a semiconductor layer with fewer crystal defects is desirable to form a homogeneous or heterogeneous semiconductor layer.

SUMMARY

Example embodiments provide a structure with a low-defect semiconductor layer and a method of fabricating the same.

In one embodiment, a semiconductor device includes: a substrate; a first insulation layer formed on the substrate in a first region; a photon absorption seed layer formed on the first insulation layer in the first region and on the substrate in a second region separate from the first region; and a photon absorption layer formed on the photon absorption seed layer in the first region. The photon absorption seed layer includes a first portion extending in a horizontal direction on the first insulation layer in the first region, a second portion extending in a horizontal direction on the substrate in the second region, and a third portion extending vertically between the first portion and the second portion.

In one embodiment, a semiconductor device includes: a substrate formed of a material having a first lattice constant, the substrate comprising a first semiconductor pattern; a first insulation layer formed on the substrate in a first region and not in a second region separate from the first region; a second semiconductor pattern formed on the substrate, the second semiconductor pattern formed of a material having a second lattice constant different from the first lattice constant, and continuously formed in the first region and the second region; and a third semiconductor pattern formed on the second semiconductor pattern in the first region, the third semiconductor pattern comprising a photon absorption layer. The second semiconductor pattern is formed of a lattice structure having a second lattice constant different from the first lattice constant; and a dislocation density of the lattice structure of the second semiconductor pattern at the first region is lower than a dislocation density of the lattice structure of the second semiconductor pattern at the second region.

In one embodiment, a photodetector includes: a substrate including a first lattice structure having a first lattice constant; an insulating layer formed above the substrate; a photon absorption seed layer formed above the insulation layer and including a second lattice structure having a second lattice constant different from the first lattice constant; a photon absorption layer epitaxially formed on the photon absorption seed layer; a substrate-to-seed layer interface at which the seed layer directly contacts the substrate; and an insulator-to-seed layer interface horizontally adjacent to the substrate-to-seed layer interface and disposed below the photon absorption layer, at which the insulation layer directly contacts the seed layer.

In one embodiment, a semiconductor device includes: a substrate; an insulator formed on the substrate in a first region of the semiconductor device and not in a second region of the semiconductor device horizontally separate from the first region; a seed layer formed on the substrate in a continuous region of the substrate including the first region and the second region; and a light-receiving epitaxial layer formed on the seed layer in the first region and not formed in the second region.

In one embodiment, a photodetector includes: a substrate; a first insulation layer formed on the substrate in a first region; a waveguide pattern formed on the first insulation layer in the first region; a second insulation layer formed on the waveguide pattern in the first region; a photon absorption seed layer including a first portion formed on and contacting the second insulation layer in the first region, a second portion formed on and contacting the substrate in a second region separate from the first region, a third portion extending between the first portion and the second portion, and a fourth portion formed in a trench in the substrate, wherein the first and second portions extend in a horizontal direction, the third portion extends in a vertical direction, and the trench is disposed beneath the third portion; and a photon absorption layer formed on the photon absorption seed layer in the first region.

In another embodiment, a method of manufacturing a semiconductor device includes: forming a substrate; forming a first insulating layer on the substrate at least at a first region of the semiconductor device and not at a second region of the semiconductor device that is adjacent to and is horizontally spaced apart from the first region; forming a photon absorption seed layer, wherein the first insulating layer is disposed between the substrate and the photon absorption seed layer at the first region, and the photon absorption seed layer is formed at least at the first region and the second region; heat treating the photon absorption seed layer; cooling the photon absorption seed layer after the heat treating to cause the photon absorption seed layer to begin crystallizing in the second region of the semiconductor device prior to beginning crystallizing in the first region of the semiconductor device; and after crystallization of the photon absorption seed layer is complete, epitaxially growing a photon absorption layer on the photon absorption seed layer at the first region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
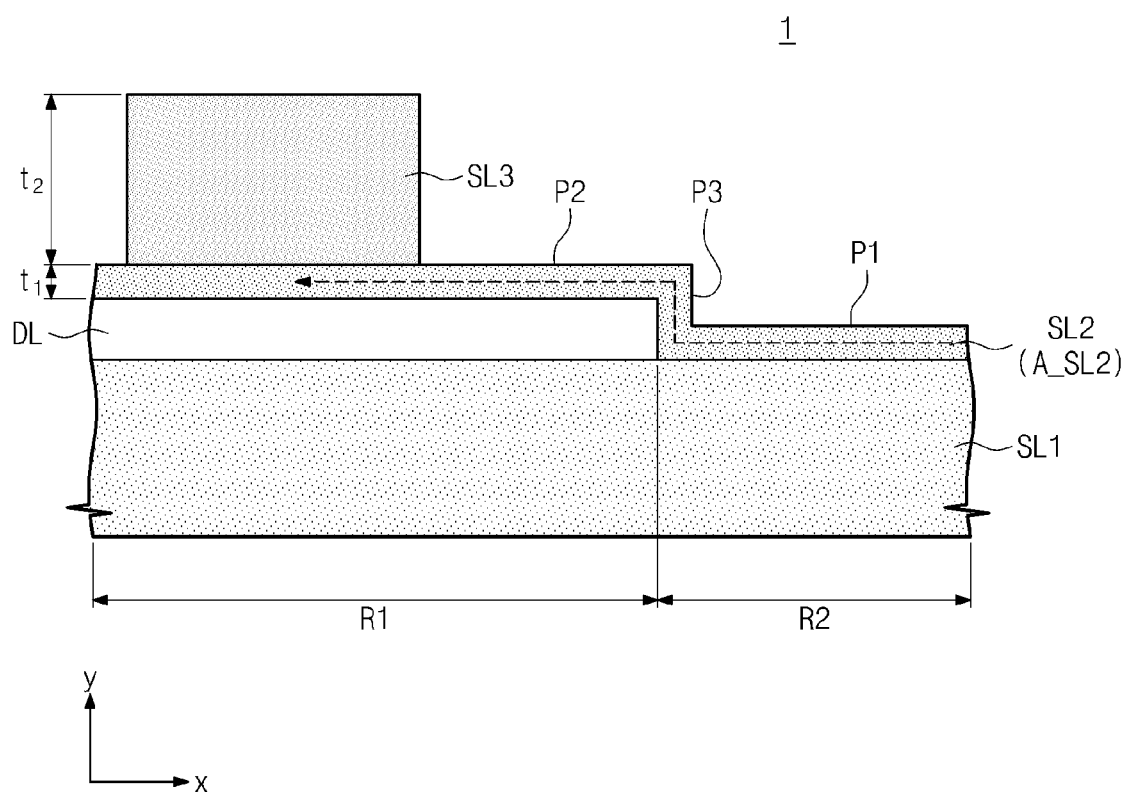
FIG. 1 is a sectional view illustrating a semiconductor device according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments, however, be embodied in many different forms and should not be construed as being limited to the embodiments set forth herein. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Terms relating to dimensions or terms such as "planar," or "coplanar," or "parallel" as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. Word such as "about" or "substantially" may be used with these terms to convey such a meaning.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Certain embodiments are described herein in connection with a semiconductor device such as a photodetector that includes a photon absorption layer or pattern that is epitaxially grown. However, these are exemplary embodiments, and aspects of the disclosure may apply to other types of semiconductor devices.

Figure 2:
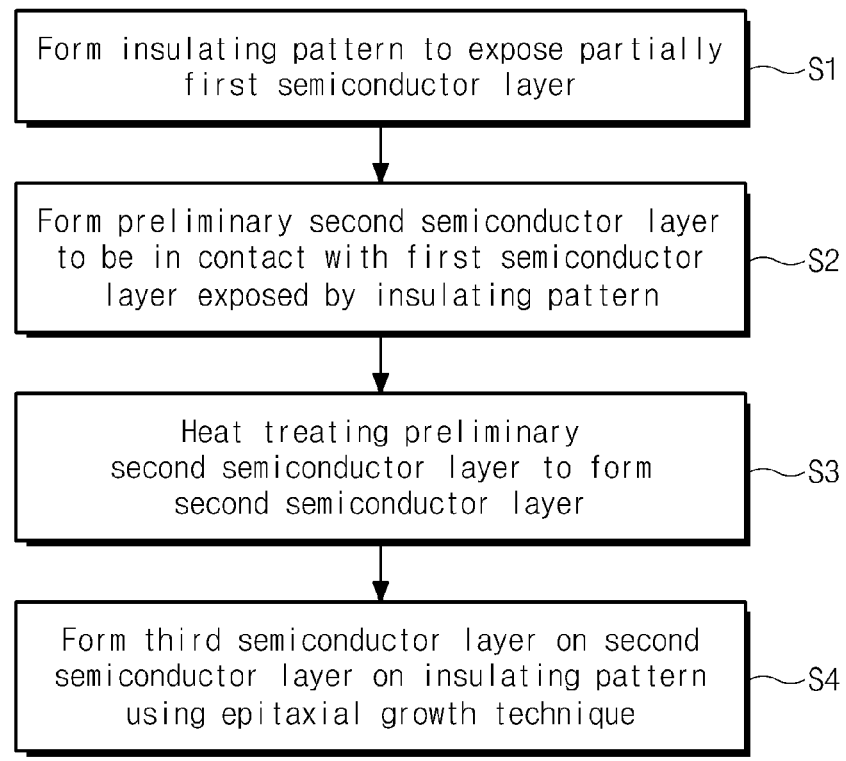
FIG. 2 is a flow chart illustrating a method of fabricating a semiconductor device, according to example embodiments.

FIG. 1 is a sectional view illustrating a semiconductor device according to example embodiments. FIG. 2 is a flow chart illustrating a method of fabricating a semiconductor device, according to example embodiments.

Referring to FIGS. 1 and 2, a semiconductor device 1 according to example embodiments includes a first semiconductor layer SL1 and an insulation layer comprising insulating pattern DL covering a portion of the first semiconductor layer SL1. For example, the first semiconductor layer SL1 may include a first region R1 covered with the insulating pattern DL and a second region R2 exposed by the insulating pattern DL. The first region R1 represents a first region of the semiconductor device 1 on which the insulating pattern DL is disposed, and the second region R2 represents a second region of the semiconductor device 1 on which the insulating pattern DL is absent. In the embodiment shown in FIG. 1, the first region R1 is horizontally separated from the second region R2. For example, the different regions R1 and R2 may represent different, non-overlapping portions of the semiconductor device.

A second semiconductor layer SL2 forming a second semiconductor pattern may be provided on the insulating pattern DL and the second region R2 of the first semiconductor layer SL1 exposed by the insulating pattern DL. In example embodiments, the second semiconductor layer SL2 is in direct contact with at least one of the insulating pattern DL or the second region R2 of the first semiconductor layer SL1. For example, in one embodiment, the second semiconductor layer SL2 is in direct contact with the insulating pattern DL in the first region R1, and the second semiconductor layer SL2 is in direct contact with the first semiconductor layer SL1 in the second region R2. The second semiconductor layer SL2 may therefore include a first portion P1 located on the second region R2 and a second portion P2 located on the insulating pattern DL. The second semiconductor layer SL2 may further include a third portion P3 located between the first and second portions P1 and P2. The third portion P3 may extend along a direction (hereinafter, y-direction) substantially perpendicular to a top surface of the first semiconductor layer SL1 to cover a sidewall of the insulating pattern DL. For example, in one embodiment, one or both of the first portion P1 and second portion P2 may be horizontal portions extending in a horizontal direction and the third portion P3 may extend in a direction (e.g., vertical direction) between the first portion P1 and second portion P2. As such, the first through third portions P1, P2, and P3 may form a step shape, or Z-shape. Although the first to third portions P1, P2, and P3 of FIG. 1 are shown to have the same thickness, example embodiments are not limited thereto.

A third semiconductor layer SL3 may be provided on the second semiconductor layer SL2. The third semiconductor layer SL3 may be spaced apart from the second region R2 in a direction (hereinafter, x-direction) substantially parallel to the top surface of the first semiconductor layer SL1. As such, the third semiconductor layer SL3 may be provided on the second portion P2 of the second semiconductor layer SL2. In one embodiment, the third semiconductor layer SL3 is not provided on the first portion P1.

The semiconductor device 1 may be formed through a fabrication process depicted by a flow chart of FIG. 2. As shown in FIG. 2, the insulating pattern DL may be formed on the first semiconductor layer SL1 to expose a portion of the first semiconductor layer SL1 (step S1). In certain embodiments, the insulating pattern DL may include at least one of a silicon oxide layer, a silicon nitride layer, or a silicon oxynitride layer. The insulating pattern DL may further include at least one of carbon (C), boron (B), or phosphorus (P). In other embodiments, the insulating pattern DL may include at least one of high-k dielectric materials (e.g., HfO, AlO, LaO, TiO, CeO, or GeO) having a dielectric constant higher than silicon oxide.

The second semiconductor layer SL2 may be formed to be in contact with the first semiconductor layer SL1 exposed by the insulating pattern DL and extend on the insulating pattern DL. The second semiconductor layer SL2 may have a different lattice constant from the first semiconductor layer SL1. The formation of the second semiconductor layer SL2 may include forming a preliminary second semiconductor layer A_SL2 being in contact with the first semiconductor layer SL1 exposed by the insulating pattern DL and extending on the insulating pattern DL (in S2). The preliminary second semiconductor layer A_SL2 may be provided to have an amorphous or polycrystalline structure. The formation of the second semiconductor layer SL2 may include, for example, heat treating the preliminary second semiconductor layer A_SL2 to form the second semiconductor layer SL2 (in S3). The heat treating process or a thermal treatment process will be described in more detail below.

The heat treating process may include a lateral melt growth method to be performed to the preliminary second semiconductor layer A_SL2. For example, the preliminary second semiconductor layer A_SL2 having the amorphous or polycrystalline structure may be heated to a particular temperature, such as its plastic deformation temperature. In example embodiments, the plastic deformation temperature may be selected to be about 80% of its melting point, but example embodiments may not be limited thereto. For example, the preliminary second semiconductor layer A_SL2 may be heated up to its melting point, or to other temperatures near the melting point. There may not be a need to perform the heat treating process or the lateral melt growth at a temperature higher than the melting point of the preliminary second semiconductor layer A_SL2, but such a heat treating process may be carried out if desired. In one embodiment, the heat treating process or the lateral melt growth may be performed at a temperature higher than the plastic deformation temperature of the preliminary second semiconductor layer A_SL2, but lower than its melting point. As the result of the heat treating process, as the heated second semiconductor layer A_SL2 cools, recrystallization of the preliminary second semiconductor layer A_SL2 may occur from the first portion P1 to the second portion P2, as depicted by a dotted arrow. For example, recrystallization may first begin to occur in the first portion P1, which is at a lower height and is physically closer to and in one embodiment is touching the first semiconductor layer SL1. Then, the crystallization may move upwards, toward the second portion P2 and up the third portion P3, before it occurs at the second portion P2. As the result of the recrystallization, the second semiconductor layer SL2 may have a substantially single-crystalline structure. Hereinafter, the term "substantially single-crystalline structure" may be used to refer to a crystalline structure that is formed to have the same orientation without an internal grain boundary. Further, it may also be used to refer to a crystalline object that includes at least one localized small portion having a grain boundary or a different orientation but is formed to have the single crystalline structure in practicality. For example, a layer having a single-crystalline structure may include a plurality of low-angle grain boundaries, in practice.

After the recrystallization, the first portion P1 may contain a plurality of lattice defects, because there is a difference in lattice constant between the first portion P1 and the first semiconductor layer SL1 that are in contact with each other. Since the second portion P2 is separated from the first semiconductor layer SL1 by the insulating pattern DL, it may not be affected by the difference in lattice constant. As the recrystallization continues from the first portion P1 to the second portion P2, the lattice defects further up in the first portion P1, as well as in the third portion P3, may be reduced. For example, dislocations in the first portion P1 may be higher at lower surfaces of the second semiconductor layer SL2 (e.g., in the second region R2), and thus, they may vanish before they reach the second portion P2. In example embodiments, the third portion P3 may contribute to the vanishing of the dislocations. For example, dislocations in the first portion P1 may continue to diminish as they move up a sidewall of the insulating pattern DL during the propagation toward the second portion P2, thereby vanishing. In example embodiments, a strain in the first portion P1 caused by the lattice constant difference may be decreased in the second portion P2, and thus, the second portion P2 may have its own lattice constant that is substantially the same lattice constant as that of a material constituting the second semiconductor layer SL2 without defects. As such, the second portion P2 of the second semiconductor layer SL2 may be formed to reduce or minimize defects, which may be caused by a difference in lattice constant between the lattice structure of the second portion P2 and the lattice structure of the first semiconductor layer SL1.

The heat treating process may be performed using, for example, one of furnace heating, rapid thermal processing (RTP), or rapid thermal annealing (RTA). In other embodiments, if a low-temperature process is required, a portion of a wafer provided with the preliminary second semiconductor layer A_SL2, not the whole wafer, may be thermally treated using, for example, a laser heating technique (e.g., using $CO_2$, EXIMER, or Nd-Yad laser).

The third semiconductor layer SL3 may be formed on the second portion P2 of the second semiconductor layer SL2 or on the insulating pattern DL (step S4). The third semiconductor layer SL3 may comprise a third semiconductor pattern. The third semiconductor layer SL3 may be formed to be horizontally spaced apart from the second region R2 of the first semiconductor layer SL1. In one embodiment, at least 80% of a bottom area of the third semiconductor layer SL3 is be overlapped with the insulating pattern DL, in plan view. For example, the entire bottom area of the third semiconductor layer SL3 may overlap with the insulating pattern DL in plan view. In other embodiments, a portion of the third semiconductor layer SL3 may be intentionally or unintentionally provided on the first portion P1, and a large portion (e.g., at least 80% of the bottom surface) of the third semiconductor layer SL3 may be provided on the second portion P2.

The third semiconductor layer SL3 may be formed on the second portion P2 using an epitaxial growth method. As such, the third semiconductor layer SL3 may be an epitaxial layer. In one embodiment, the third semiconductor layer SL3 may include a semiconductor material, whose lattice constant is different from that of the first semiconductor layer SL1. In example embodiments, the third semiconductor layer SL3 may be formed of or include the same material as the second semiconductor layer SL2. In other embodiments, the third semiconductor layer SL3 does not include the same material as the second semiconductor layer SL2. In the case where the third semiconductor layer SL3 is formed of the same material as the second semiconductor layer SL2, the third semiconductor layer SL3 may be formed using a homoepitaxial growth method. In the case where the third semiconductor layer SL3 is formed of a different material from the second semiconductor layer SL2, the third semiconductor layer SL3 is formed using a heteroepitaxial growth method.

The growth of the third semiconductor layer SL3 may be performed using the second portion P2 of the second semiconductor layer SL2 as a seed layer. Accordingly, the third semiconductor layer SL3 may be locally formed on the second portion P2, whose dislocation density is lower than that of the first portion P1. Here, as described above, the second portion P2 of the second semiconductor layer SL2 may be formed to reduce or minimize defects, which may be caused by a difference in lattice constant between the second portion P2 and the first semiconductor layer SL1. Accordingly, when compared with the case where the third semiconductor layer SL3 is directly formed on the first semiconductor layer SL1 or on the first portion P1 of the first semiconductor layer SL2, it is possible to significantly reduce crystal defects in the third semiconductor layer SL3. In certain embodiments, the third semiconductor layer SL3 is not formed on the first portion P1. For example, the third semiconductor layer SL3 may be locally formed on the second portion P2, after forming a mask pattern covering the first portion P1.

If the second semiconductor layer SL2 is thicker than a specific thickness, it may be deformed by a surface tension applied thereto during the heat treating process to have a ball-like shape. This may deteriorate electrical and optical characteristics of the semiconductor device 1. To avoid this problem, the second semiconductor layer SL2 may be formed to be thinner than the specific thickness. For example, the second semiconductor layer SL2 may be thinner than the third semiconductor layer SL3. In example embodiments, the second semiconductor layer SL2 may be formed to have a thickness $t_2$ that is smaller than about one-third of a sum of thicknesses $t_1$ and $t_2$ of the second and third semiconductor layers SL2 and SL3. In one embodiment, the thickness $t_2$ of the third semiconductor layer SL3 may be about 700 Å or less. In this case, the thickness $t_1$ of the second semiconductor layer SL2 may be about 350 Å or less. If the second semiconductor layer SL2 is thicker than $(t_1+t_2)/3$, the second semiconductor layer SL2 may be deformed by a surface tension during the heat treating process, as described above.

In example embodiments, it is possible to mitigate technical problems resulting from a difference in lattice constant between semiconductor layers. A way of providing a buffer layer between the semiconductor layers may be used to mitigate such problems. For example, the buffer layer may be formed of a material, whose lattice constant is an intermediate value between the semiconductor layers, and further, the buffer layer may be formed to have a thickness greater than a specific thickness, because the semiconductor layers should be sufficiently spaced apart from each other in a vertical direction to mitigate the problems. According to example embodiments, the second semiconductor layer SL2 may be formed using a lateral growth or lateral recrystallization from the first semiconductor layer SL1, and thus, it is possible to suppress the technical problems resulting from a difference in lattice constant between semiconductor layers, even when the second semiconductor layer SL2 is formed to have a small thickness (e.g., thinner than the buffer layer).

The semiconductor device 1 may include various structures, such as a heterogeneous semiconductor junction. For example, the semiconductor device 1 may be a portion of a photodetector. Depending on the type of the semiconductor device 1, materials for the first to third semiconductor layer SL1-SL3 may be changed. Hereinafter, for the sake of simplicity, the description that follows will refer to an example embodiment in which the semiconductor device 1 is a photodetector, but example embodiments are not limited thereto.

Figure 3:
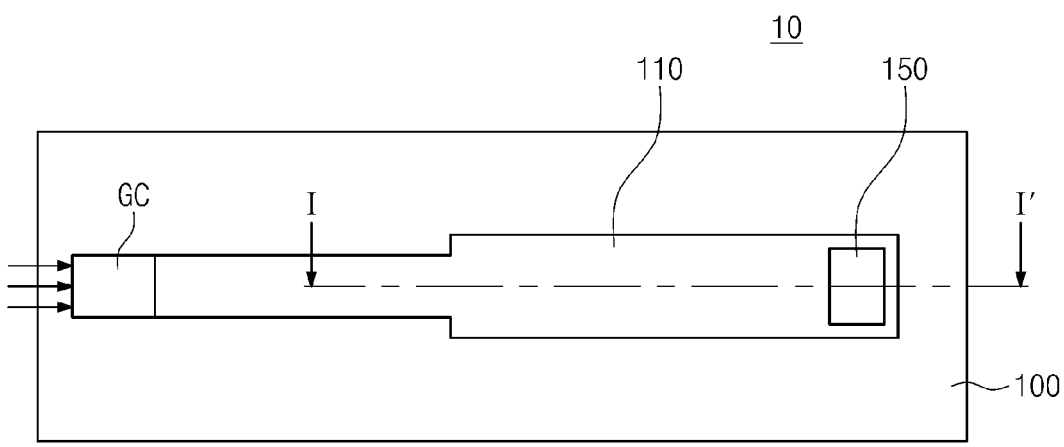
FIG. 3 is a plan view of a photodetector according to example embodiments.

FIG. 3 is a plan view of a photodetector according to example embodiments. FIGS. 4 through 9 are sectional views taken along line I-I' of FIG. 3 to describe the photodetector and its fabrication method, according to example embodiments. The photodetector may be part of a system, such as an optical-to-electrical converter, for example, that converts optical signals to electrical signals.

Figure 4:
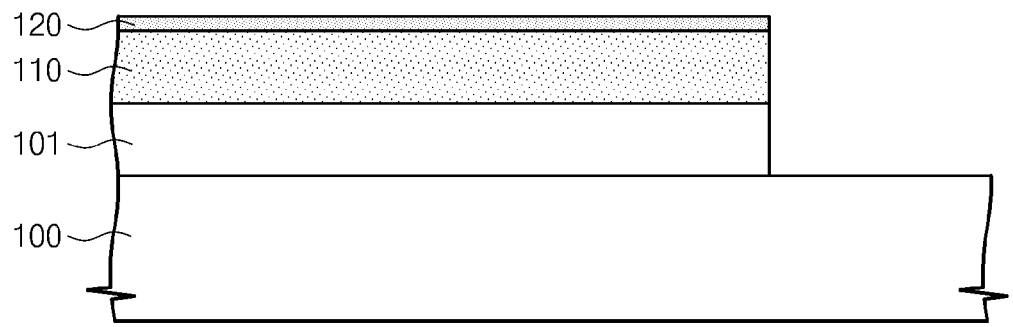
FIGS. 4 through 9 are sectional views taken along line I-I' of FIG. 3 to describe the photodetector and its fabrication method, according to example embodiments.

Referring to FIGS. 3 and 4, a first insulation layer forming a first insulating pattern 101, a waveguide pattern 110, and a second insulation layer forming a second insulating pattern 120 may be sequentially formed on a substrate 100. The substrate 100 may be a semiconductor substrate or a semiconductor-based structure. For example, in one embodiment, the substrate 100 may be a silicon wafer. The first insulating pattern 101, the waveguide pattern 110, and the second insulating pattern 120 may be formed to expose a portion of the substrate 100. In example embodiments, a first insulating layer, a waveguide layer, and a second insulating layer may be sequentially formed on the substrate 100 and be patterned using a dry or wet etching process to expose the portion of the substrate 100.

For example, the first insulating pattern 101 may include silicon oxide, silicon nitride, or silicon oxynitride. The first insulating pattern 101 may further include at least one of carbon (C), boron (B), or phosphorus (P). In other embodiments, the first insulating pattern 101 may have a high-k dielectric material, whose dielectric constant is higher than silicon oxide. The waveguide pattern 110 may be formed of a semiconductor layer. For example, the waveguide pattern 110 may be formed of a silicon layer. The waveguide pattern 110 may be an epitaxial layer grown from the substrate 100. The second insulating pattern 120 may include at least one of silicon nitride, silicon oxynitride, or silicon carbonitride.

The second insulating pattern 120 may further include at least one of boron (B) or phosphorus (P). In other embodiments, the second insulating pattern 120 may be a high-k dielectric material, whose dielectric constant is higher than silicon oxide. The first and second insulating patterns 101 and 120 may be formed using, for example, a chemical vapor deposition or an atomic layer deposition. The second insulating pattern 120 may be formed to have a smaller thickness than the first insulating pattern 101 and the waveguide pattern 110. For example, a thickness of the second insulating pattern 120 may be smaller than about one-third of that of the waveguide pattern 110.

Figure 5:
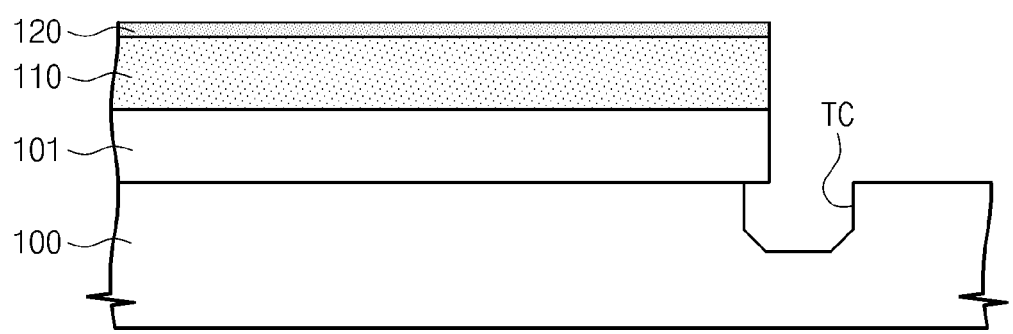

Referring to FIGS. 3 and 5, a trench TC may be formed in the exposed portion of the substrate 100. The trench TC may be formed to include a portion overlapped with the first and second insulating patterns 101 and 120, in plan view. For example, the trench TC may be formed to expose partially a bottom surface of the first insulating pattern 101. The formation of the trench TC may include forming a mask pattern to cover a portion of the substrate 100 and the second insulating pattern 120, and then, performing a dry and/or wet etching process. For example, the trench TC may be formed by a wet etching process, in which an etching solution containing $NH_4OH$ is used.

Figure 6:
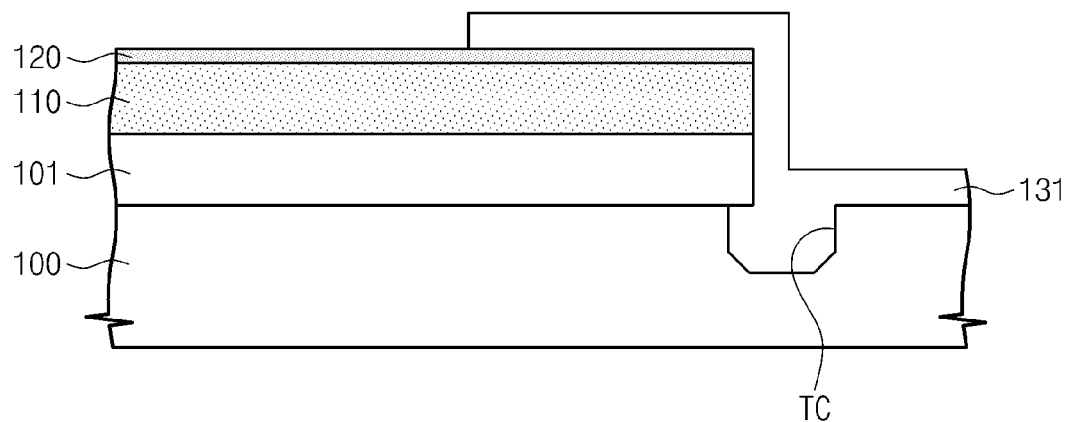

Referring to FIGS. 3 and 6, a preliminary second semiconductor pattern 131 may be formed to cover a surface of the exposed portion of the substrate 100 and a portion of a top surface of the second insulating pattern 120. The preliminary second semiconductor pattern 131 may include a material, whose lattice constant is different from the substrate 100. For example, in the case where the substrate 100 is a silicon wafer, the preliminary second semiconductor pattern 131 may contain germanium. Since silicon has a lattice constant of about 5.43 Å and germanium has a lattice constant of about 5.56 Å, a lattice mismatch δ therebetween is about 4.2%. The preliminary second semiconductor pattern 131 may be formed to have an amorphous or polycrystalline structure. For example, the preliminary second semiconductor pattern 131 may be formed using a chemical vapor deposition or a physical vapor deposition. The formation of the preliminary second semiconductor pattern 131 may include forming a semiconductor layer to cover the whole region of the substrate 100 and performing a pattering process on the resulting structure with the semiconductor layer. The preliminary second semiconductor pattern 131 may be formed to fill the trench TC. The preliminary second semiconductor pattern 131 may be formed to be thinner than the waveguide pattern 110. For example, the preliminary second semiconductor pattern 131 may be formed to have a thickness of about 700 Å or less.

Figure 7:
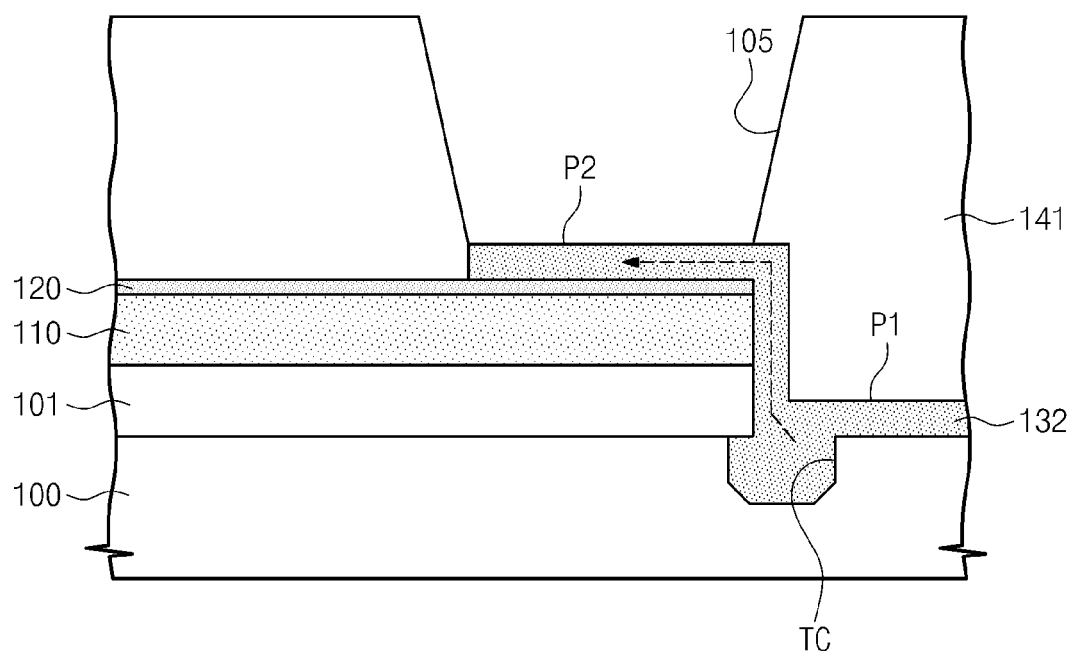

Referring to FIGS. 3 and 7, a first interlayered insulating layer 141 may be formed to cover the whole region of the substrate 100. For example, the first interlayered insulating layer 141 may include silicon oxide or silicon oxynitride. The preliminary second semiconductor pattern 131 may be thermally treated to form a second semiconductor pattern 132. The heat treating process may be performed in such a way that the preliminary second semiconductor pattern 131 is re-crystallized using a lateral melt growth method. The preliminary second semiconductor pattern 131 may be heated up to a plastic deformation temperature or more, when it may be formed to have an amorphous or polycrystalline structure. For example, in the case where the preliminary second semiconductor pattern 131 is formed of a germanium layer, the preliminary second semiconductor pattern 131 may be heated up to about 900° C. or more. The preliminary second semiconductor pattern 131 may be heated at a temperature of about 900° C. for 1 hour. After the cooling and recrystallization, the second semiconductor pattern 132 may include the first portion P1 in contact with the substrate 100 and the second portion P2 on the second insulating pattern 120. Since the second portion P2 is horizontally and vertically separated from the surface of the substrate 100, defects resulting from the lattice constant difference may be reduced in the second portion P2. For example, the second portion P2 may have a dislocation density that is lower than that of the first portion P1. In example embodiments, the first portion P1 may have a dislocation density of about $2\times10^7$ ea/cm$^2$, and the second portion P2 may have a dislocation density of about $1\times10^6$ ea/cm$^2$.

The trench TC may contribute to prevent dislocations from being propagated from the first portion P1 to the second portion P2 during the recrystallization. For example, when the dislocations are grown from the first portion P1 toward the second portion P2, their propagation may be stopped in the trench TC or by a bottom surface of the first insulating pattern 101. Accordingly, the second semiconductor pattern 132 in the trench TC may have a dislocation density that is smaller than that of the first portion P1 and is greater than that of the second portion P2.

An opening 105 may be formed to expose the second portion P2 through the first interlayered insulating layer 141. The formation of the opening 105 may include, for example, a dry etching process. In example embodiments, the heat treating process may be performed before the formation of the opening 105, but example embodiments are not limited thereto. For example, the heat treating process may be performed after the formation of the opening 105 or before the formation of the first interlayered insulating layer 141.

Figure 8:
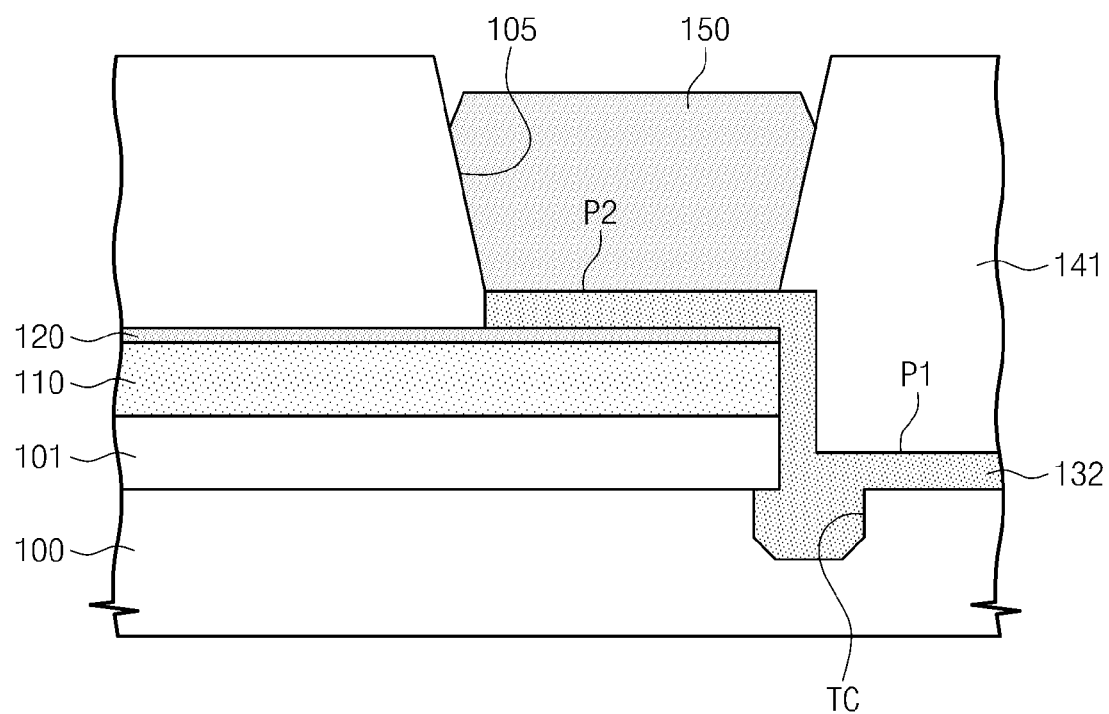

Referring to FIGS. 3 and 8, a third semiconductor pattern 150 may be locally formed on the second portion P2 exposed by the opening 105. The third semiconductor pattern 150 may be formed by an epitaxial growth process, in which the second portion P2 is used as a seed layer. Accordingly, the third semiconductor pattern 150 may have a substantially single crystalline structure. For example, the third semiconductor pattern 150 may be formed using a molecular beam epitaxy (MBE), a vapor phase epitaxy (VPE), or a liquid phase epitaxy (LPE). The third semiconductor pattern 150 may include, for example, germanium. For example, the third semiconductor pattern 150 may be formed using at least one of $GeH_4$, $Ge_2H_6$, $GeH_2Cl_2$, $GeCl_4$, or $Ge_2Cl_6$ as a precursor.

The second semiconductor pattern 132 may be formed to be thinner than the third semiconductor pattern 150. For example, the second semiconductor pattern 132 may have a thickness of about 700 Å or less. The second semiconductor pattern 132 may be formed in such a way that a thickness thereof is smaller than about one-third of the sum of thicknesses of the second and third semiconductor patterns 132 and 150. Otherwise, the second semiconductor pattern 132 may be deformed by a surface tension that may be exerted thereto during the heat treating process.

The third semiconductor pattern 150 may be formed using the second portion P2 of the second semiconductor pattern 132 as a seed layer. The first portion P1, whose dislocation density is higher than that of the second portion P2, may be covered with the first interlayered insulating layer 141, and thus, the third semiconductor pattern 150 may not be formed on the first portion P1. Accordingly, the number or density of crystal defects in the third semiconductor pattern 150 may be reduced.

In certain embodiments, the different patterns 101, 120, 132, and 141 may have different reflective indices. For example, interlayer insulating pattern 141 and first insulating pattern 101 may be formed using a material such as $SiO_2$, and may have a reflective index of about 1. Second insulating pattern 120 may be formed using a material such as SiN, SiON, or SiCN, and may have a reflective index controlled to be about 2.5. Second semiconductor pattern 132 may be formed using a material such as Ge, and may have a reflective index of about 3. As such, the reflective index of interlayer insulating pattern 141 and/or first insulating pattern 101 may have a first value that is lower than a reflective index of second insulating pattern 120, which is lower than a reflective index of the second semiconductor pattern 132.

Figure 9:
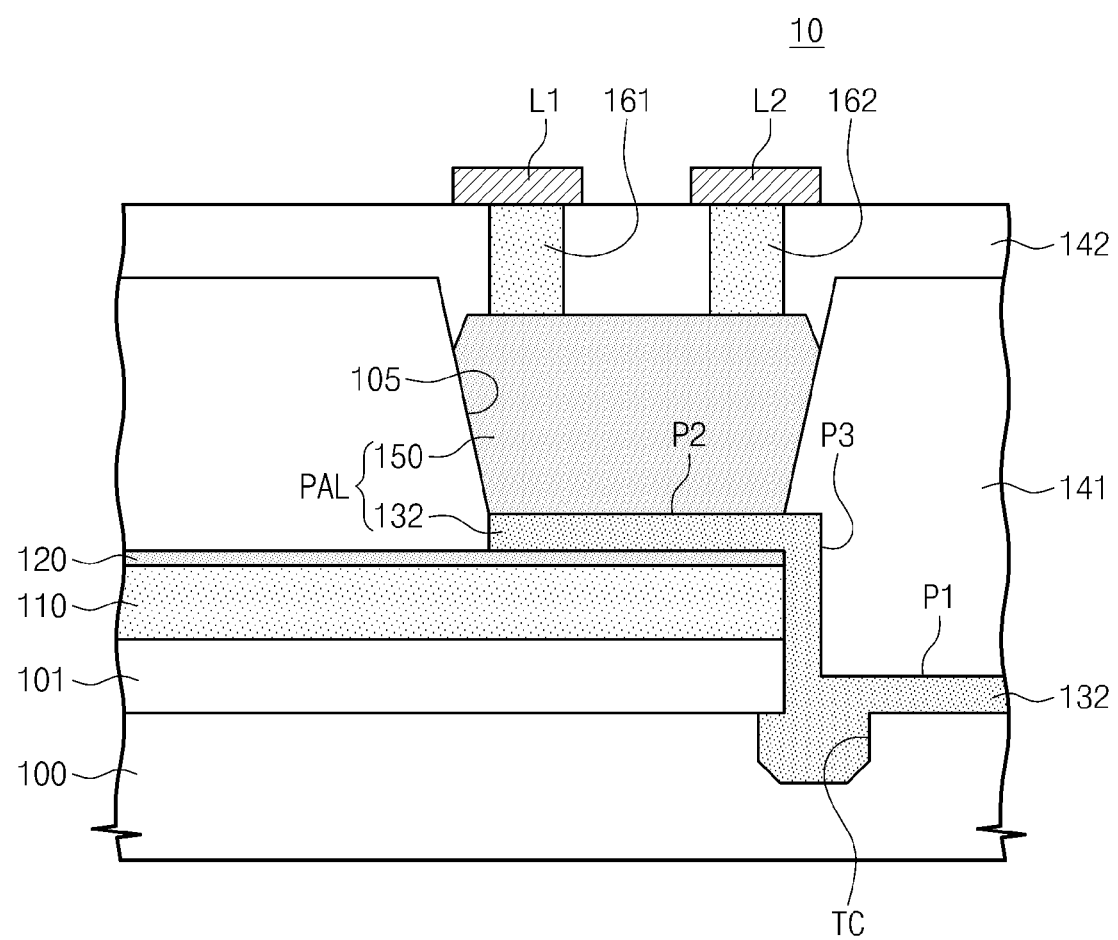

Referring to FIGS. 3 and 9, a second interlayered insulating layer 142 may be formed to cover the first interlayered insulating layer 141. For example, the second interlayered insulating layer 142 may include at least one of silicon oxide, silicon nitride, or transparent insulating materials. A first electrode 161 and a second electrode 162 may be formed through the second interlayered insulating layer 142 and be connected to a top portion of the third semiconductor pattern 150. The first and second electrodes 161 and 162 may include, for example, a doped semiconductor layer and/or a metal layer. For example, a conductivity type of the first electrode 161 may be an n-type, while a conductivity type of the second electrode 162 may be a p-type. A first conductive pattern L1 and a second conductive pattern L2 may be formed on the first electrode 161 and the second electrode 162, respectively. The first and second conductive patterns L1 and L2 may include a portion serving as a wire or as a pad to be connected to the wire.

A photodetector according to example embodiments of the inventive concept will be described with reference to FIGS. 3 and 9.

The photodetector 10 may include the waveguide pattern 110 on the substrate 100 and a photon absorption layer PAL on the waveguide pattern 110. A light may be incident into the waveguide pattern 110 through an end portion thereof and be incident into the photon absorption layer PAL through the second insulating pattern 120, thereby producing electric charges in the photon absorption layer PAL. In example embodiments, in the end portion of the waveguide pattern 110, a grating coupler GC may be provided to enable light to be effectively incident into the waveguide pattern 110.

To prevent the light propagating through the waveguide pattern 110 from vanishing, the first insulating pattern 101 and the second insulating pattern 120 may be provided under and on the waveguide pattern 110, respectively. The second insulating pattern 120 may extend between the top surface of the waveguide pattern 110 and the bottom surface of the photon absorption layer PAL and prevent electric charges produced in the photon absorption layer PAL from being discharged.

The photon absorption layer PAL may include the third semiconductor pattern 150 provided in the opening 105. The photon absorption layer PAL may include an extended portion that is extended from the bottom of the third semiconductor pattern 150 to cover a top surface of the substrate 100 exposed by the insulating patterns 101 and 120. For example, the photon absorption layer PAL may include the second semiconductor pattern 132 extending from between the third semiconductor pattern 150 and the second insulating pattern 120 to between the first interlayered insulating layer 141 and the substrate 100. The second semiconductor pattern 132 may be thinner than the third semiconductor pattern 150. For example, a thickness of the second semiconductor pattern 132 may be smaller than about one-third of that of the third semiconductor pattern 150.

The second semiconductor pattern 132 may include the first portion P1 in contact with the top surface of the substrate 100 and the second portion P2 on the second insulating pattern 120. The first portion P1 may be covered with the first interlayered insulating layer 141. The second portion P2 may have a dislocation density that is lower than that of the first portion P1. The second semiconductor pattern 132 may further include the third portion P3 vertically extending along the sidewalls of the insulating patterns 101 and 120.

The trench TC may be provided in an upper portion of the substrate 100 located below a portion (e.g., the third portion P3) between the first and second portions P1 and P2, and the trench TC may be filled with the second semiconductor pattern 132. The trench TC may be partially extended below the first insulating pattern 101. Thus, the second semiconductor pattern 132 may also be partially extended below the first insulating pattern 101.

The second semiconductor pattern 132 may serve as a seed layer for the third semiconductor pattern 150. Therefore, as used herein, the second semiconductor pattern 132 may be referred to as a photon absorption seed layer, and the third semiconductor pattern 150 may be referred to as a photon absorption layer, or a light-receiving epitaxial layer. The surface where the substrate 100 contacts the second semiconductor pattern 132 may be referred to as a substrate-to-seed layer interface, and the surface where the insulating layer 101 contacts the second semiconductor pattern 132 may be referred to as an insulator-to-seed layer interface. These terms may apply to other layers or interfaces that have a similar structure and/or function as described in other portions of this disclosure.

According to example embodiments, the substrate 100, the second semiconductor pattern 132, and the third semiconductor pattern 150 of the photodetector 10 may be formed of silicon, germanium, and germanium, respectively, but example embodiments are not limited thereto. Further, the second and third semiconductor patterns 132 and 150 may contain the same element, but example embodiments are not limited thereto. The following Table 1 shows example combinations of materials for the substrate 100 or SL1, the second semiconductor pattern 132 or SL2, and the third semiconductor pattern 150 or SL3.

TABLE 1

|     | A  | B    | C    | D      | E    | F      | G      | H    | I      |
|-----|----|------|------|--------|------|--------|--------|------|--------|
| SL 1 | Si | Si   | Si   | Si     | Si   | Si     | Si     | Ge   | Ge     |
| SL 2 | Ge | GeSn | SiGe | Ge     | GaAs | InP    | InAlAs | GaAs | InP    |
| SL 3 | Ge | Ge   | Ge   | InGaAs | GaAs | InGaAs | InGaAs | GaAs | InGaAs |

Material for the substrate 100 or SL1, the second semiconductor pattern 132 or SL2, and the third semiconductor pattern 150 or SL3 may not be limited to group-IV semiconductor elements and be variously changed. As shown in Table 1, the second semiconductor pattern 132 or SL2 may include a material, whose lattice constant is greater than that of the third semiconductor pattern 150 or SL3, and thus, a tensile stress from the second semiconductor pattern 132 or SL2 may be exerted to the third semiconductor pattern 150 or SL3. For example, according to the embodiment B of Table 1, the second semiconductor pattern 132 or SL2 may contain GeSn and the third semiconductor pattern 150 or SL3 may contain Ge having a lattice constant smaller than GeSn, and thus, a tensile stress may be exerted to the third semiconductor pattern 150 or SL3. In this case, due to the tensile stress, an energy bandgap of the germanium (Ge) layer may be changed from an indirect bandgap structure to a direct bandgap structure.

According to the embodiment C of Table 1, the second semiconductor pattern 132 or SL2 may include $Si_xGe_y$ (where 0<x<100 and 0<y<100), which may be an intermediate phase of materials (e.g., Ge and Si) for the substrate 100 or SL1 and the third semiconductor pattern 150 or SL3. In this case, a lattice constant of the second semiconductor pattern SL2 may be an intermediate value between those of the substrate SL1 and the third semiconductor pattern SL3. In example embodiments, the third semiconductor pattern 150 or SL3 may be configured in such a way that a compressive stress is applied thereto by the second semiconductor pattern 132 or SL2.

The second semiconductor pattern 132 or SL2 and the third semiconductor pattern 150 or SL3 may contain substantially the same element, but as shown in the embodiment D, they may not be configured to contain the same elements or material. If there is a relatively big difference in a lattice constant, a buffer layer may be further provided between the second semiconductor pattern 132 or SL2 and the third semiconductor pattern 150 or SL3. For example, as shown in the embodiment D, an InP layer and/or an InAlAs layer may be provided between the second semiconductor pattern 132 or SL2 and the third semiconductor pattern 150 or SL3 to serve as the buffer layer.

In example embodiments, the substrate 100, the second semiconductor pattern 132, and the third semiconductor pattern 150 may be formed of materials that are different from each other. In other example embodiments, the substrate 100, the second semiconductor pattern 132, and the third semiconductor pattern 150 may be formed of the same material but have crystal structures different from each other.

The second interlayered insulating layer 142 may be provided to cover the first interlayered insulating layer 141, and the first and second electrodes 161 and 162 may be connected to a top portion of the third semiconductor pattern 150 through the second interlayered insulating layer 142. The first and second electrodes 161 and 162 may include, for example, a doped semiconductor layer and/or a metal layer. The first and second electrodes 161 and 162 may include, for example, at least one of silicon, germanium, titanium, titanium nitride, or tungsten. The first electrode 161 may have a conductivity type of, for example, n-type, while the second electrode 162 may have a conductivity type of, for example, p-type. The first conductive pattern L1 and the second conductive pattern L2 may be formed on the first electrode 161 and the second electrode 162, respectively. At least one of the first and second conductive patterns L1 and L2 may include a portion serving as a wire or a pad to be connected to the wire. According to the present embodiment, the second semiconductor pattern 132 and the third semiconductor pattern 150 may be in a substantially undoped or intrinsic state. In one embodiment, the structure depicted in FIG. 9 may form an optical PIN diode.

According to example embodiments, it is possible to reduce effectively a density of lattice defects (e.g., dislocation) in a photon absorption layer. This makes it possible to suppress technical problems, such as a leakage current, a noise, a signal weakening, or an increase in charge recombination centers. Accordingly, a photodetector can have an improved reactivity and sensitivity.

Figure 10:
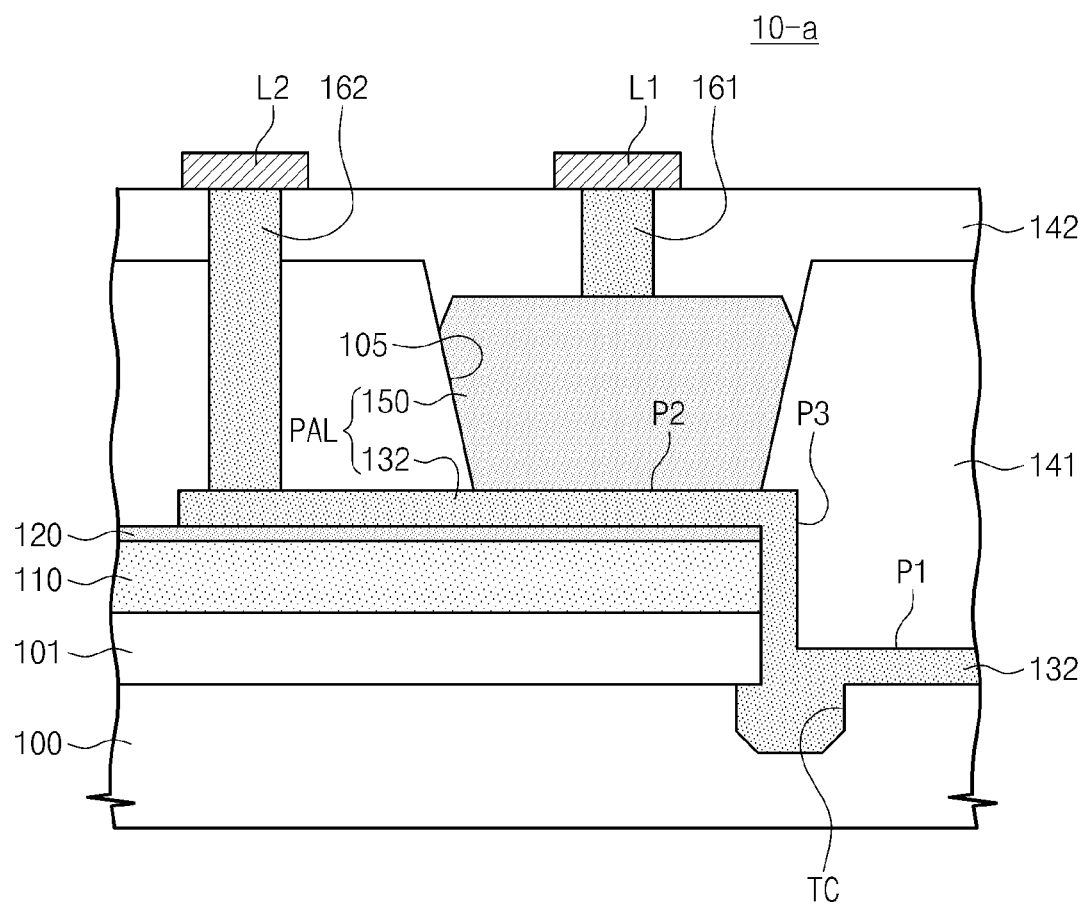
FIG. 10 is a sectional view illustrating a photodetector according to other example embodiments.

FIG. 10 is a sectional view illustrating a photodetector 10-a according to other example embodiments. For the sake of brevity, the elements and features of this example that are similar to those previously shown and described will not be described in much further detail.

According to the embodiment of FIG. 10, the first electrode 161 may be formed on the third semiconductor pattern 150, while the second electrode may not be formed on the third semiconductor pattern 150.

Accordingly, the second electrode 132 may be connected to the second semiconductor pattern 132. For example, the second semiconductor pattern 132 may be extended between the first interlayered insulating layer 141 and the second insulating pattern 120, and the second electrode 162 may be connected to the second semiconductor pattern 132 through the first and second interlayered insulating layers 141 and 142. The first conductive pattern L1 and the second conductive pattern L2 may be provided on the first and second electrodes 161 and 162, respectively. The second semiconductor pattern 132 may be formed to have a different conductivity type from that of the first electrode 161. For example, in the case where the first electrode 161 is of p-type, the second semiconductor pattern 132 may be of n-type and the third semiconductor pattern 150 may be substantially undoped or intrinsic. Except for such differences, the photodetector may be configured to have substantially the same features as the previous embodiments of FIG. 9.

Figure 11:
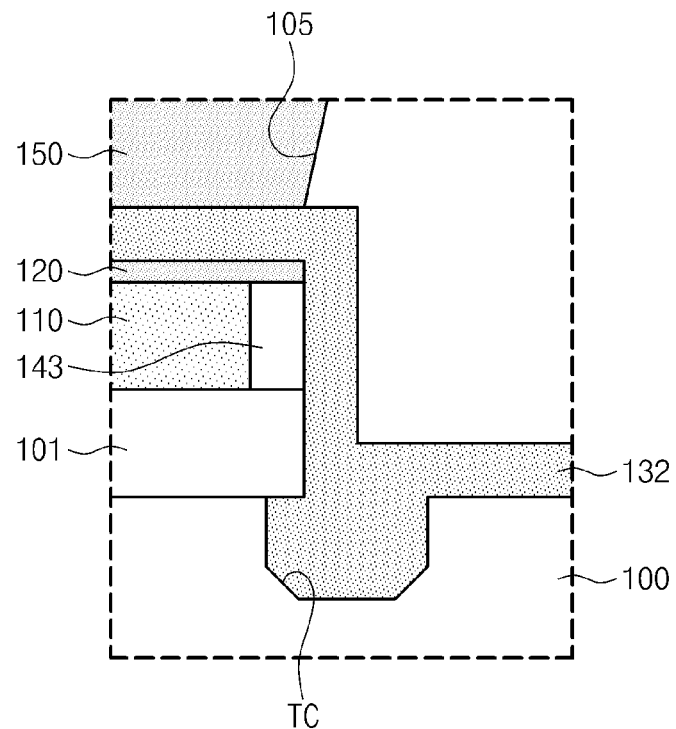
FIGS. 11 through 13 are sectional views illustrating portions of photodetectors according to still other example embodiments.
Figure 12:
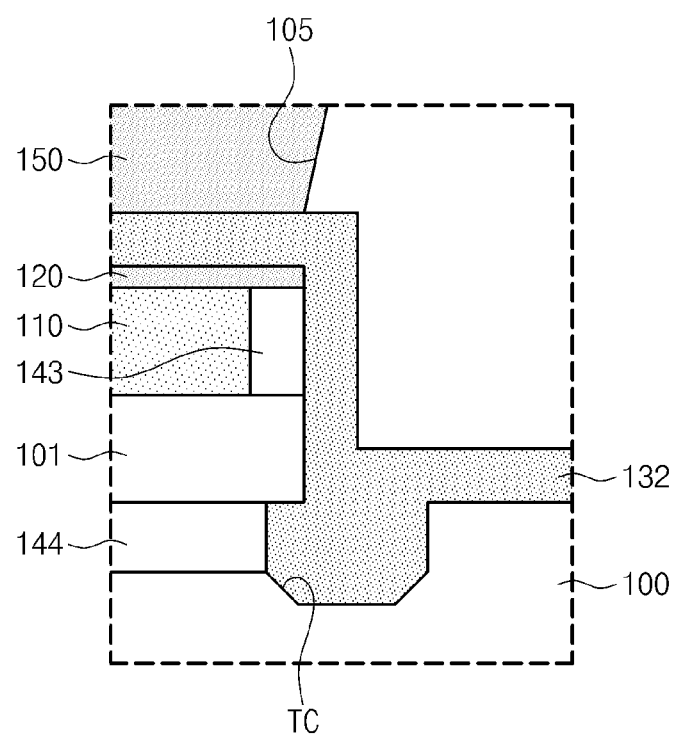
Figure 13:
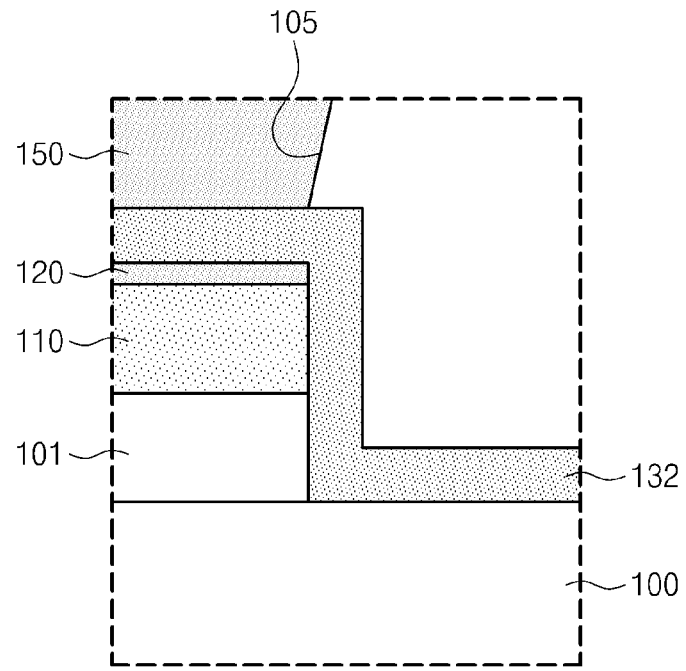

FIGS. 11 through 13 are sectional views illustrating portions of photodetectors according to still other example embodiments. For the sake of brevity, the elements and features of this example that are similar to those previously shown and described will not be described in much further detail.

Referring to FIG. 11, a capping insulating layer 143 may be provided between the waveguide pattern 110 and the second semiconductor pattern 132. The capping insulating layer 143 may include at least one of a silicon oxide layer, a silicon nitride layer, or a silicon oxynitride layer. The capping insulating layer 143 may be formed by, for example, a thermal oxidation process. Before the formation of the second semiconductor pattern 132, the thermal oxidation process may be performed to form the capping insulating layer 143 on the exposed sidewall of the waveguide pattern 110. In this case, the resulting oxide layer may be removed to partially expose the top surface of the substrate 100.

Referring to FIG. 12, a third insulating pattern 144 may be provided between the first insulating pattern 101 and the substrate 100 to define a sidewall of the trench TC. The third insulating pattern 144 may include at least one of a silicon oxide layer, a silicon nitride layer, or a silicon oxynitride layer. In example embodiments, the formation of the third insulating pattern 144 may include forming a recess region in a top portion of the substrate 100, before the formation of the first insulating pattern 101, and then, forming an insulating layer in the recess region.

Referring to FIG. 13, the formation of the trench may be omitted, and thus, the second semiconductor pattern 132 may be conformally formed on the substrate 100. In example embodiments, the lowermost surface of the second semiconductor pattern 132 may be coplanar with that of the first insulating pattern 101.

Figure 14:
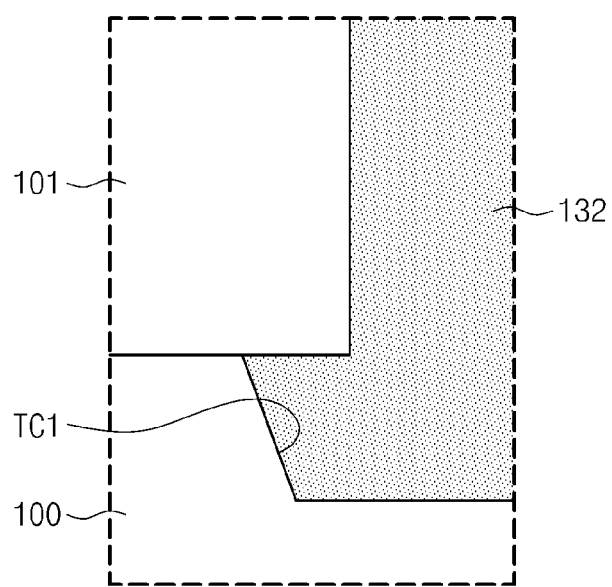
FIGS. 14 through 16 are sectional views illustrating trenches according to example embodiments.
Figure 15:
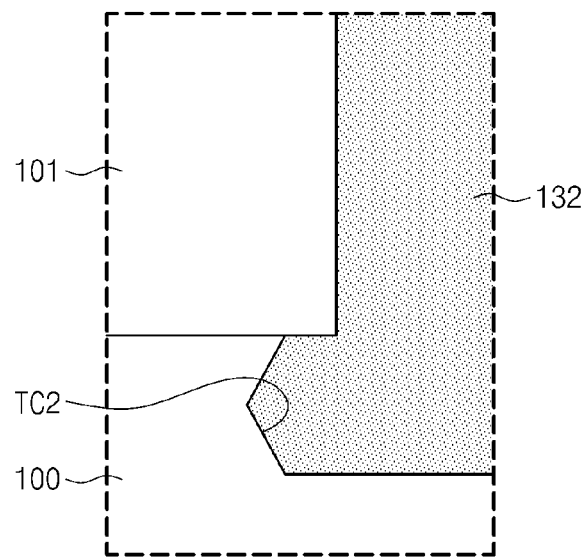
Figure 16:
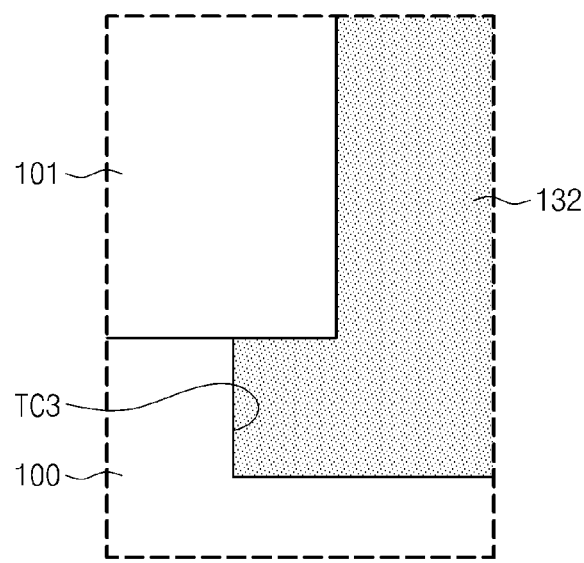

FIGS. 14 through 16 are sectional view illustrating trenches according to certain example embodiments. As shown in FIG. 14, a trench TC1 may be formed to have a sidewall that is not perpendicular to the top surface of the substrate 100 (e.g., it may be at an acute or obtuse angle to a top surface of the substrate). For example, the sidewall of the trench TC1 may extend obliquely from a bottom surface thereof to a bottom surface of the first insulating pattern 101. As shown in FIG. 15, a trench TC2 may be formed to have an outward protruding profile. As shown in FIG. 16, a trench TC3 may be formed to have a sidewall that is substantially perpendicular to the top surface of the substrate.

Figure 17:
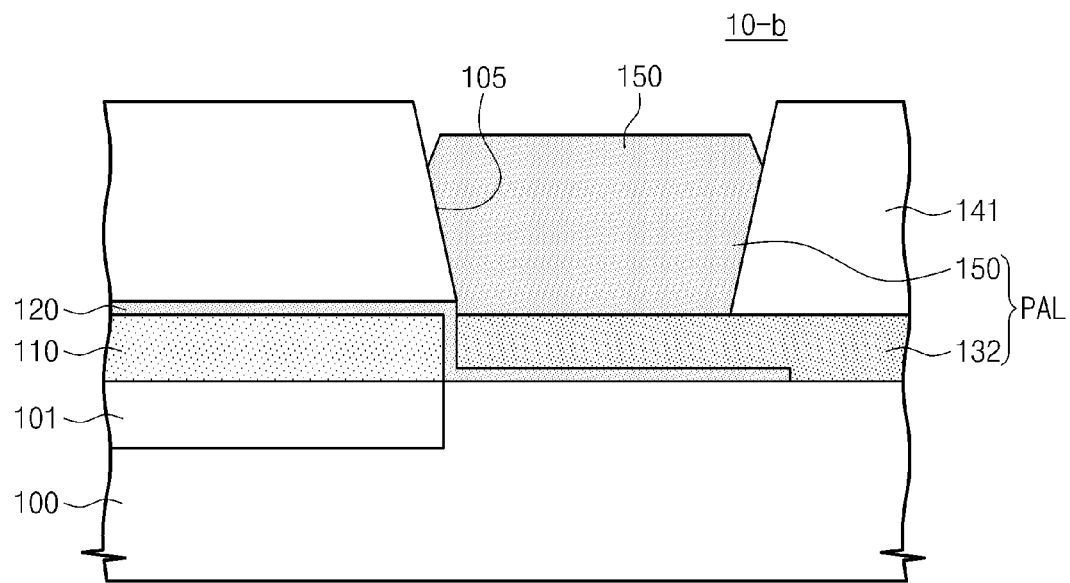
FIGS. 17 and 18 are sectional views illustrating photodetectors according to other example embodiments.
Figure 18:
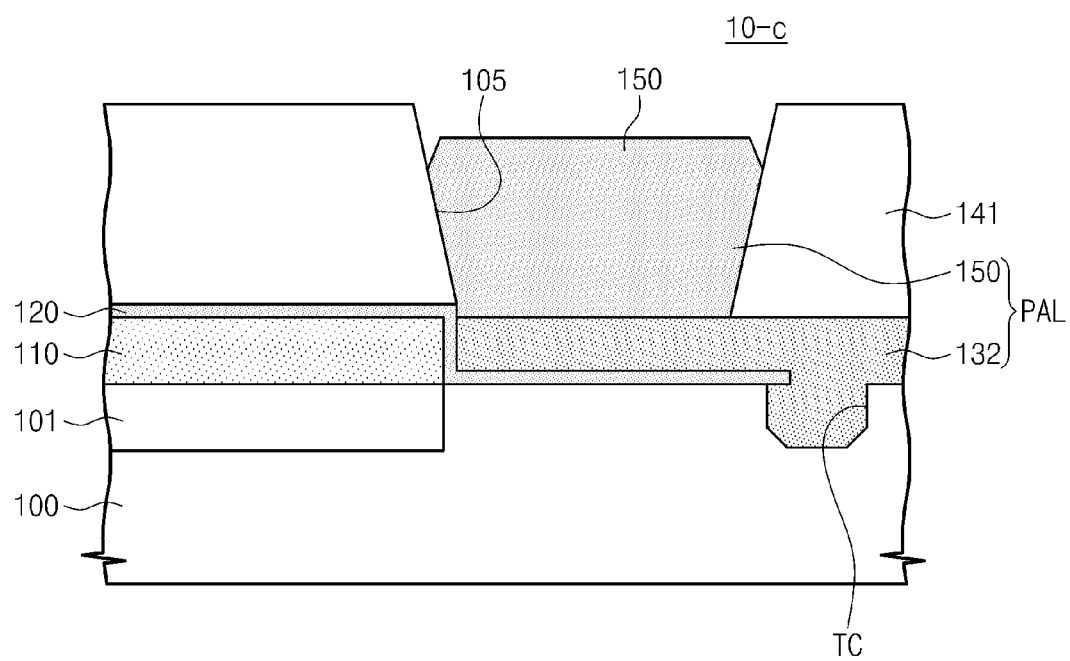

FIGS. 17 and 18 are sectional views illustrating photodetectors according to other example embodiments. For the sake of brevity, the elements and features of this example that are similar to those previously shown and described will not be described in much further detail.

Referring to FIGS. 17 and 18, photodetectors 10-b and 10-c may be configured to include the second semiconductor pattern 132 horizontally spaced apart from the waveguide pattern 110 by the second insulating pattern 120 interposed therebetween. Photons transmitted through the waveguide pattern 110 may be incident into a sidewall of the second semiconductor pattern 132 through the second insulating pattern 120. As shown in FIG. 18, the photodetector 10-c may be configured to include an additional trench TC. The photodetectors of FIGS. 17 and 18 may be configured to have the same electrode structure as that described with reference to FIG. 9 or FIG. 10. For example, the second semiconductor pattern 132 may be substantially intrinsic as that of FIG. 9 or be of p-type or n-type as that of FIG. 10.

FIGS. 19 through 22 are sectional views illustrating photodetectors according to yet other example embodiments. For the sake of brevity, the elements and features of this example that are similar to those previously shown and described will not be described in much further detail.

Figure 19:
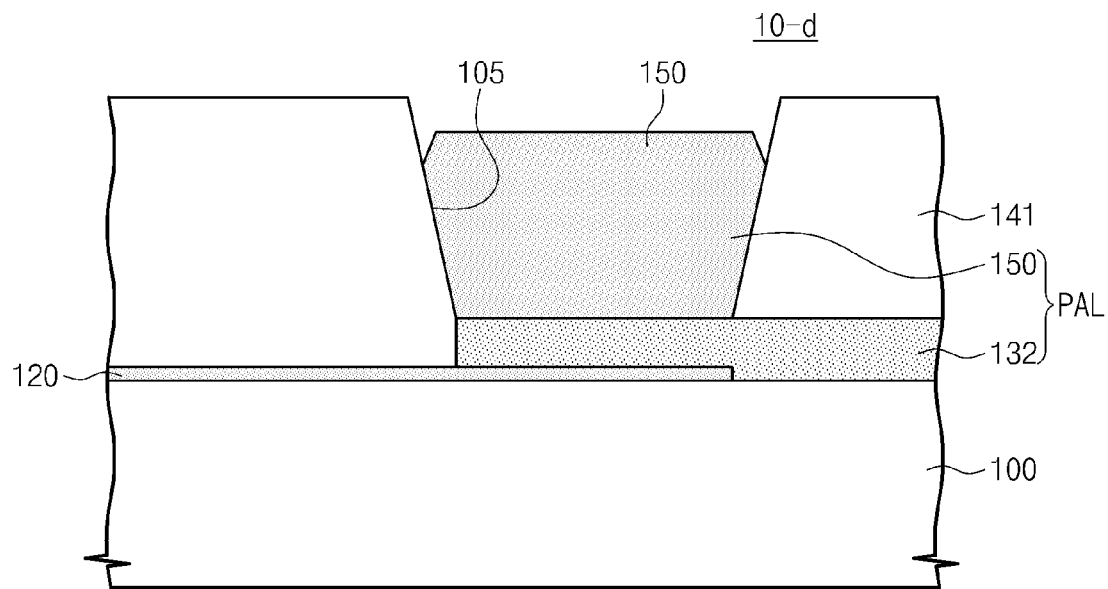
FIGS. 19 through 22 are sectional views illustrating photodetectors according to yet other example embodiments.
Figure 20:
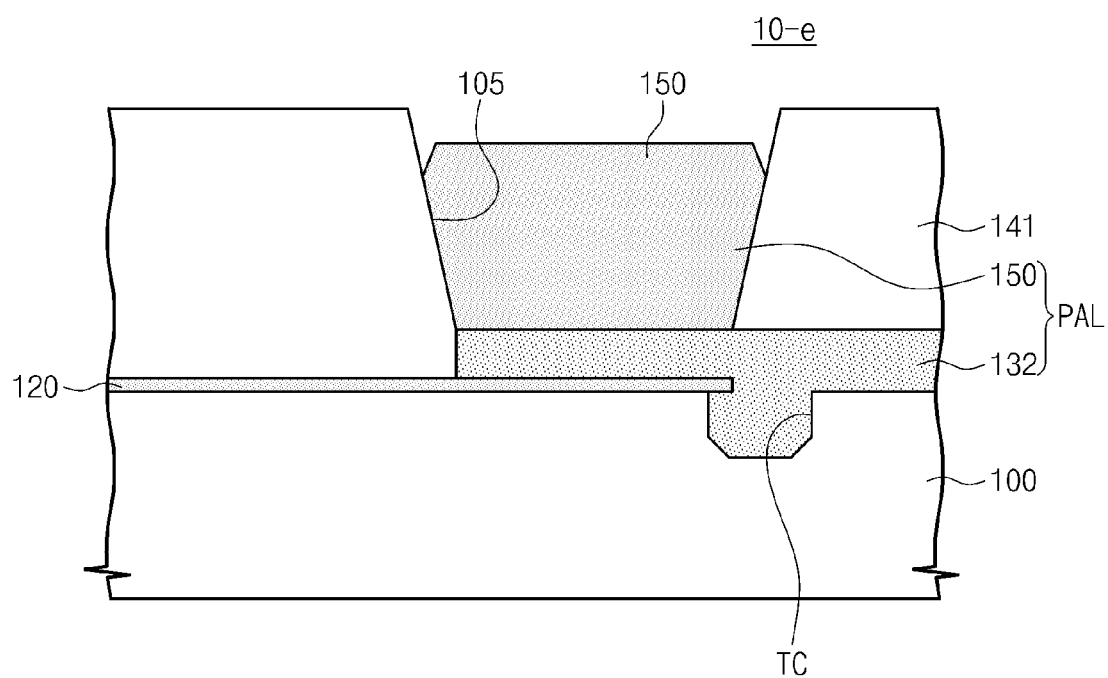
Figure 21:
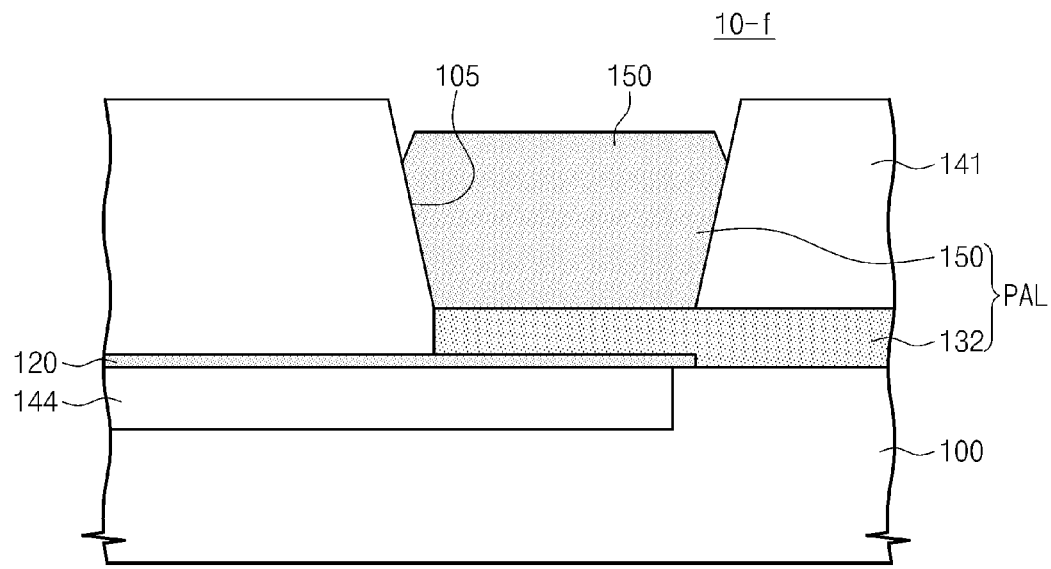
Figure 22:
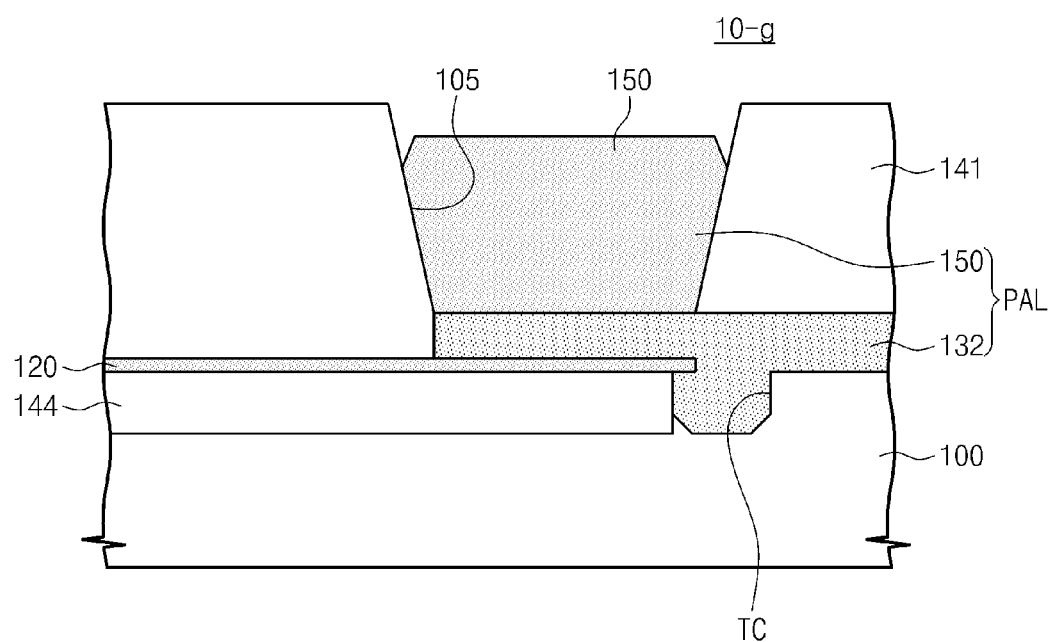

As shown in FIGS. 19 through 22, photodetectors may be a top-incident type photodetector, in which a waveguide pattern is not provided. These are also referred to as surface-illuminated photodetectors. These photodetectors may be configured in such a way that an incident light is incident onto a top surface of the third semiconductor pattern 150 (e.g., from a fiber located above the third semiconductor pattern 150). The photodetectors may be configured to include the second insulating pattern 120, as shown in FIGS. 19 and 20 or both of the second and third insulating patterns 120 and 144, as shown in FIGS. 21 and 22. Further, the photodetectors may be configured to have the trench TC, as shown in FIGS. 20 and 22. The photodetectors of FIGS. 19 and 22 may be configured to have the same electrode structure as that described with reference to FIG. 9 or FIG. 10. For example, the second semiconductor pattern 132 may be substantially intrinsic as that of FIG. 9 or be of p-type or n-type as that of FIG. 10.

Figure 23A:
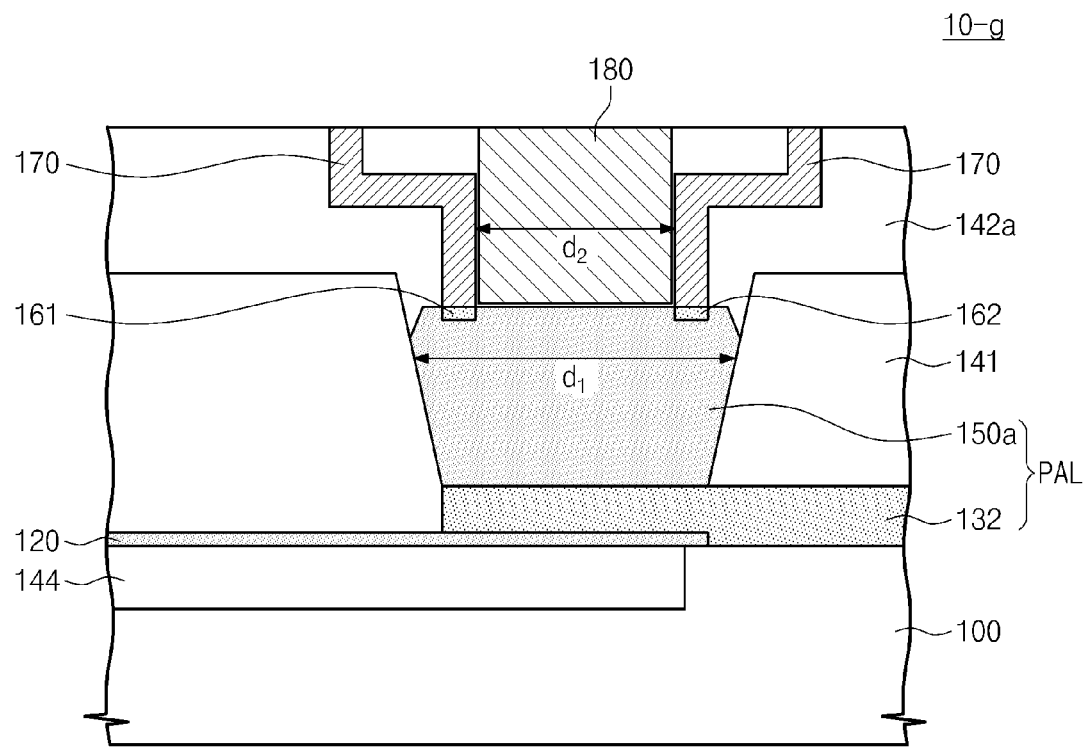
FIGS. 23A and 23B are respective cross-sectional and plan views illustrating photodetectors according to yet other example embodiments.
Figure 23B:
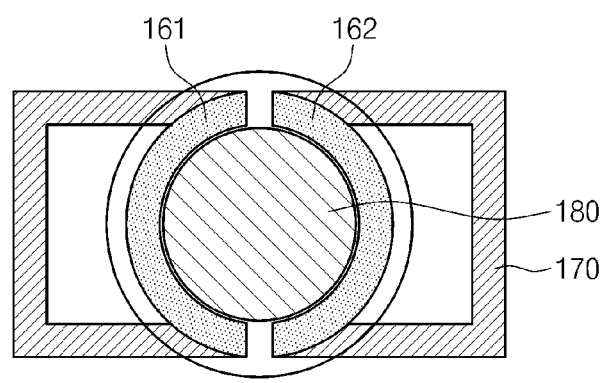

FIGS. 23A and 23B depict an exemplary embodiment of a surface-illuminated photodetector 10-g. FIG. 23A shows a cross-sectional view, and FIG. 23B shows a plan view of certain elements of the surface-illuminated photodetector. Similar to FIG. 22, FIG. 23A includes similar elements 100, 144, 120, 132, and 141 as described above. In addition, FIG. 23A includes a third semiconductor pattern 150a (e.g., a photon absorption layer) that includes doped regions 161 and 162. For example, one of the doped regions (e.g., 161)

may have a first doping type (e.g., p-type), and the other of the doped regions (e.g., 162) may have as second doping type (e.g., an opposite type such as n-type). In one embodiment, each of the first doped region and the second doped region has a curved shape when viewed from above the photon absorption layer. For example, each region may have a semi-circular shape. As such, the photodetector is configured to receive light from a location above the photon absorption layer 150a.

In one embodiment, as shown in FIGS. 23A and 23B, the photodetector 10-g is configured to receive light from an optical fiber 180. In one embodiment, the photodetector 10-g may be part of a PIN diode. The photodetector 10-g may further include a second interlayered insulating layer 142a, and metal lines 170. The metal lines 170 may include through vias, and may transmit electrical signals that have been converted from optical signals received at the photodetector 10-g from the optical fiber 180.

As shown in FIG. 23A, a diameter of the photon absorption layer, when viewed from above, may have a first value $d_1$, such as for example about 50-60 μm. A width of an optical fiber used with the photodetector 10-g, and thus a diameter between the curved doped regions 161 and 162, may have a second value $d_2$, such as about 50 μm.

Figure 24:
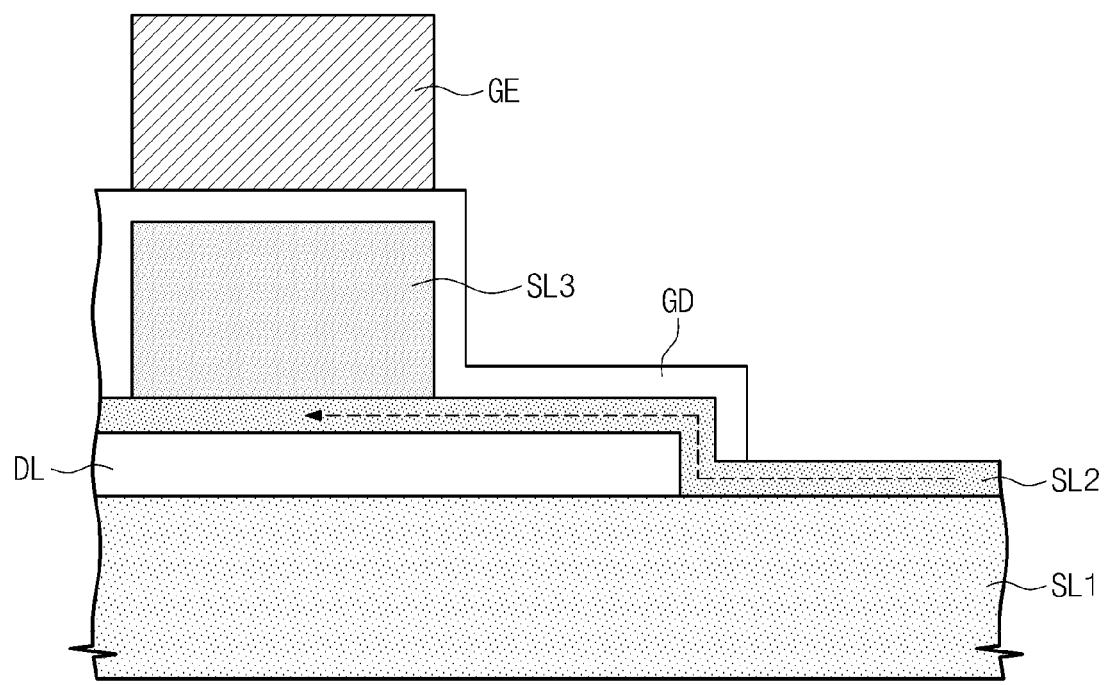
FIG. 24 is a sectional view illustrating a portion of a transistor including the semiconductor device of FIG. 1, according to one exemplary embodiment.

FIG. 24 is a sectional view illustrating a portion of a transistor including the semiconductor device of FIG. 1. For example, the semiconductor device 1 may be a portion of a fin-on-insulator (FOI) structure. In example embodiments, the first semiconductor layer SL1, the second semiconductor layer SL2, and the third semiconductor layer SL3 may be formed of a silicon layer, a silicon-germanium layer, and a germanium layer, respectively, but example embodiments are not limited thereto. Materials for the layers may be variously changed, depending on desired properties of the transistor.

A gate insulating layer GD and a gate electrode GE may be sequentially provided on the third semiconductor layer SL3. In example embodiments, the third semiconductor layer SL3 may serve as a channel region of the transistor.

Figure 25:
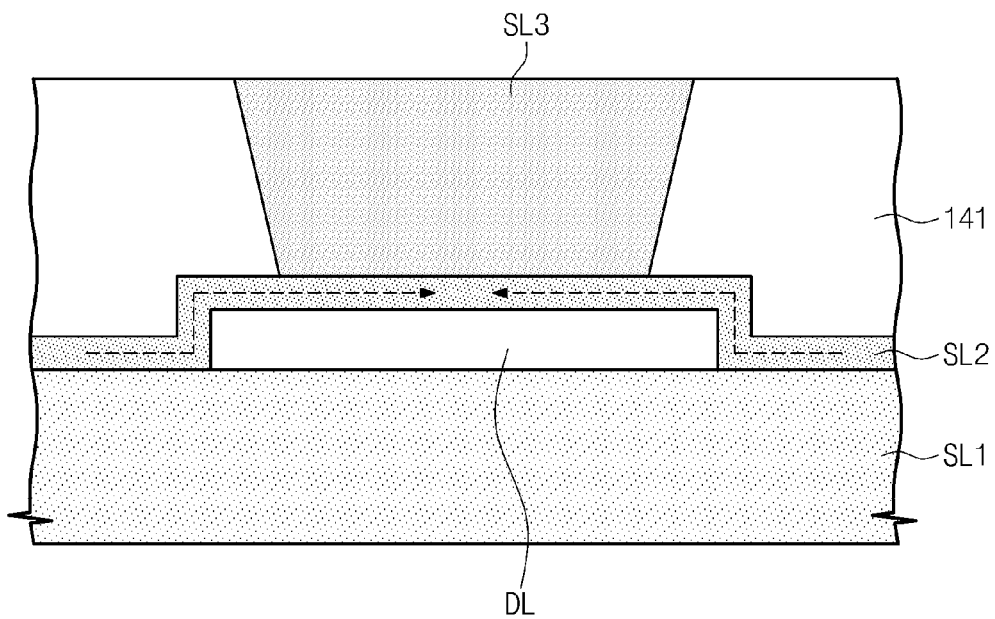
FIG. 25 is a sectional view illustrating a portion of a light-emitting device (e.g., LED or LD) including the semiconductor device of FIG. 1, according to one exemplary embodiment.

FIG. 25 is a sectional view illustrating a portion of a light-emitting device (e.g., LED or LD) including the semiconductor device of FIG. 1. For example, the first to third semiconductor layers SL1-SL3 may be formed of materials enumerated in Table 2.

TABLE 2

|     | A   | B    | C   | D    | E    | F    |
| --- | --- | ---- | --- | ---- | ---- | ---- |
| SL1 | Si  | SiC  | Si  | Si   | SiC  | SiC  |
| SL2 | ZnS | ZnTe | AlN | ZnS  | ZnTe | AlN  |
| SL3 | GaN | GaN  | GaN | GaAs | GaAs | GaAs |

The third semiconductor layer SL3 may include a p-type semiconductor region, an n-type semiconductor region, and a light-emitting region provided between the p-type and n-type semiconductor regions. The light-emitting region may be configured to have a multi quantum well (MQW) structure. The second semiconductor layer SL2 may start to be recrystallized from both sides of the insulating pattern DL.

Figure 26:
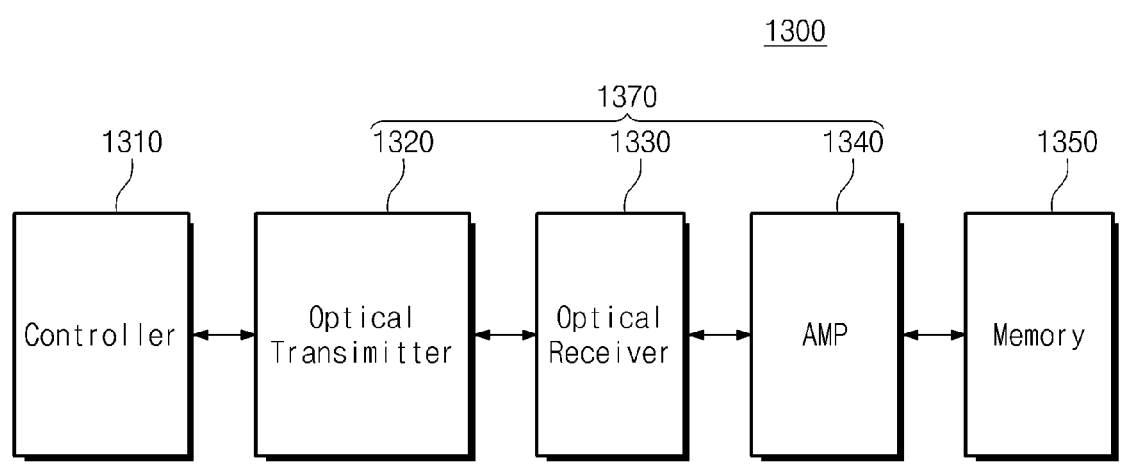
FIG. 26 is a schematic diagram illustrating an electronic device with a photodetector according to example embodiments.

FIG. 26 is a schematic diagram illustrating an electronic device with a photodetector according to example embodiments of the inventive concept.

Referring to FIG. 26, an electronic device 1300 may be, for example, one of a PDA, a laptop computer, a portable computer, a web tablet, a cordless phone, a cellular phone, a digital music player, a wire or wireless electronic device, or a complex electronic device including at least two thereof. The electronic device 1300 may include a controller 1310, a memory 1350, and an optical interconnection 1370 connecting them to each other. The optical interconnection 1380 may include an optical transmitter 1320, which may be configured to convert data transmitted from the controller 1310 (e.g., as an electrical signal) to an optical signal, and an optical receiver 1330, which may be configured to convert data transmitted from the optical transmitter 1320 (e.g., as an optical signal) to an electrical signal. The photodetector, according to example embodiments described above, may constitute a portion of the optical receiver 1330. For example, it may receive an optical signal from an optical fiber and convert it to an electrical signal. The light-emitting device may be used as a constituent part of the optical transmitter 1320. Signals transmitted from the optical receiver 1330 may be amplified by a sense amplifier 1340. The controller 1310 may include, for example, at least one of a micro-processor, a digital signal processor, a micro controller, and so forth. The memory 1330 may be used to store, for example, code to be executed by the controller 1310. The memory 1330 may additionally be used to store a user data.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique.

According to example embodiments, it is possible to reduce the number or density of crystal defects in an epitaxially-grown semiconductor layer. Further, it is possible to significantly reduce defects (e.g., dislocations or lattice defects) in a photon absorption layer. This makes it possible to suppress technical problems, such as a leakage current, a noise, a signal weakening, or an increase in charge recombination centers. Accordingly, a photodetector can have an improved reactivity and sensitivity.

While example embodiments have been particularly shown and described, it will be understood by one of ordinary skill in the art that variations in form and detail may be made therein without departing from the spirit and scope of the attached claims.

What is claimed is:
1. A semiconductor device comprising:
a substrate;
a first insulation layer formed on the substrate in a first region of the semiconductor device, the first insulation layer formed to have a top surface at a first vertical height and a bottom surface at a second vertical height lower than the first vertical height;

a photon absorption seed layer formed on the first insulation layer in the first region and on the substrate in a second region of the semiconductor device separate from the first region; and a photon absorption layer formed on the photon absorption seed layer in the first region at a vertical height above the first vertical height, such that the photon absorption seed layer is vertically between the first insulation layer and the photon absorption layer, wherein:

the photon absorption seed layer includes a first portion extending in a horizontal direction on the first insulation layer in the first region and located at a vertical height above the first vertical height, a second portion extending in a horizontal direction on the substrate in the second region and located at a vertical height below the first vertical height, and a third portion extending vertically from the first vertical height to the second vertical height between the first portion and the second portion, wherein a top surface of the photon absorption seed layer in the first region is higher than a top surface of the photon absorption seed layer in the second region.

2. The semiconductor device of claim 1, wherein:
the first region is horizontally separated from the second region; and
the photon absorption seed layer is directly adjacent to the substrate in the second region.

3. The semiconductor device of claim 1, wherein:
the photon absorption layer is an epitaxial layer formed on the photon absorption seed layer in the first region.

4. The semiconductor device of claim 1, wherein:
the substrate is formed of a first material having a first lattice constant; and
the photon absorption seed layer is formed of a second material having a second lattice constant different from the first lattice constant.

5. The semiconductor device of claim 4, wherein:
the photon absorption layer is formed of the same second material as the photon absorption seed layer.

6. The semiconductor device of claim 1, wherein:
the photon absorption seed layer includes a fourth portion that extends into a trench in the substrate.

7. The semiconductor device of claim 1, wherein:
a thickness of the photon absorption seed layer in the first region is smaller than one-third of the sum of thicknesses of the photon absorption seed layer and the photon absorption layer at the first region.

8. The semiconductor device of claim 7, wherein:
the thickness of the photon absorption seed layer in the first region is equal to or less than 350 A.

9. The semiconductor device of claim 1, further comprising:
a second insulation layer on the substrate in the first region; and
a waveguide pattern on the substrate in the first region, wherein, in the first region, the first insulation layer is disposed between the substrate and the waveguide pattern, the waveguide pattern is disposed between the first insulation layer and the second insulation layer, and the second insulation layer is disposed between the waveguide pattern and the photon absorption seed layer.

10. The semiconductor device of claim 1, further comprising:
at least one electrode connected to the photon absorption layer.

11. The semiconductor device of claim 1, wherein:
the substrate is formed of a lattice structure having a first lattice constant;
the photon absorption seed layer is formed of a lattice structure having a second lattice constant different from the first lattice constant; and
a dislocation density of the lattice structure of the photon absorption seed layer at the first region is lower than a dislocation density of the lattice structure of the photon absorption seed layer at the second region.

12. The semiconductor device of claim 1, wherein:
the photon absorption seed layer is continually formed from the first region to the second region.

13. The semiconductor device of claim 1, further comprising:
a first interlayered insulating layer on the photon absorption seed layer in the second region, the first interlayered insulating layer adjacent the photon absorption layer.

14. A semiconductor device comprising:
a substrate formed of a material having a first lattice constant, the substrate comprising a first semiconductor pattern;
a first insulation layer formed on the substrate in a first region of the semiconductor device and not in a second region of the semiconductor device separate from the first region, the first insulation layer having a top surface at a first vertical height and a bottom surface at a second vertical height lower than the first vertical height;
a second semiconductor pattern formed on the substrate, the second semiconductor pattern formed of a material having a second lattice constant different from the first lattice constant, and continuously formed in the first region and the second region; and
a third semiconductor pattern formed on the second semiconductor pattern in the first region, the third semiconductor pattern comprising a photon absorption layer, wherein the second semiconductor pattern is vertically between the first insulation layer and the third semiconductor pattern, wherein:

the second semiconductor pattern has a first top surface above the first vertical height in the first region, and has a second top surface below the first top surface in the second region;
the second semiconductor pattern is formed of a lattice structure having a second lattice constant different from the first lattice constant; and
a dislocation density of the lattice structure of the second semiconductor pattern at the first region is lower than a dislocation density of the lattice structure of the second semiconductor pattern at the second region.

15. The semiconductor device of claim 14, wherein the second semiconductor pattern forms a seed layer for the third semiconductor pattern.

16. The semiconductor device of claim 15, wherein the third semiconductor pattern is an epitaxial layer.

17. The semiconductor device of claim 14, wherein:
the semiconductor device is a photodetector configured to receive light at the third semiconductor pattern.

18. The semiconductor device of claim 17, wherein the photodetector includes a waveguide pattern coupled to the third semiconductor pattern for receiving the light.

19. The semiconductor device of claim 14, wherein:
the first region is horizontally separated from the second region; and the second semiconductor pattern is directly adjacent to the substrate in the second region.

20. The semiconductor device of claim 14, wherein:
the second semiconductor pattern is formed of the same material as the third semiconductor pattern.

21. The semiconductor device of claim 14, wherein:
the second semiconductor pattern includes a portion that extends into a trench in the substrate.

22. The semiconductor device of claim 14, further comprising:
at least one electrode connected to the third semiconductor pattern.

23. The semiconductor device of claim 14, wherein:
the second semiconductor pattern includes a first horizontal portion in the first region, a second horizontal portion in the second region at a different vertical level from the first horizontal portion, and a vertical portion connecting the first horizontal portion to the second horizontal portion.

24. A semiconductor device comprising
a substrate formed of a material having a first lattice constant, the substrate comprising a first semiconductor pattern;
a first insulation layer formed on the substrate in a first region of the semiconductor device and not in a second region of the semiconductor device separate from the first region;
a second semiconductor pattern formed on the substrate, the second semiconductor pattern formed of a material having a second lattice constant different from the first lattice constant, and continuously formed in the first region and the second region; and
a third semiconductor pattern formed on the second semiconductor pattern in the first region, the third semiconductor pattern comprising a photon absorption layer,
wherein:
the second semiconductor pattern is formed of a lattice structure having a second lattice constant different from the first lattice constant; and
a dislocation density of the lattice structure of the second semiconductor pattern at the first region is lower than a dislocation density of the lattice structure of the second semiconductor pattern at the second region, wherein:
a thickness of the second semiconductor pattern in the first region is smaller than one-third of the sum of thicknesses of the second and third semiconductor patterns at the first region.

25. The semiconductor device of claim 24, wherein:
the thickness of the second semiconductor pattern in the first region is equal to or less than 350 Å.

26. A photodetector comprising:
a substrate including a first lattice structure having a first lattice constant;
an insulating layer formed above the substrate;
a photon absorption seed layer formed above the insulation layer and including a second lattice structure having a second lattice constant different from the first lattice constant;
a photon absorption layer epitaxially formed on the photon absorption seed layer;
a substrate-to-seed layer interface at which the seed layer directly contacts the substrate; and
an insulator-to-seed layer interface at which insulation layer directly contacts the seed layer, wherein the insulator-to-seed layer interface is horizontally adjacent to the substrate-to-seed layer interface and disposed below the photon absorption layer,
wherein the seed layer has a top surface and a bottom surface, the top surface is further from the substrate than the bottom surface, and a portion of the top surface of the seed layer is not covered by the photon absorption layer.

27. The photodetector of claim 26, further comprising:
a trench in the substrate into which the photon absorption seed layer extends.

28. The photodetector of claim 26, wherein:
the photon absorption seed layer is continually formed from the substrate-to-seed layer interface to the insulator-to-seed layer interface.

29. The photodetector of claim 26, wherein:
a dislocation density of the photon absorption seed layer at the insulator-to-seed layer interface is lower than a dislocation density of the photon absorption seed layer at the substrate-to-seed layer interface.

30. The photodetector of claim 26, wherein:
the photon absorption seed layer forms a step shape.

31. A semiconductor device, comprising:
a substrate;
an insulator formed on the substrate in a first region of the semiconductor device and not in a second region of the semiconductor device horizontally separate from the first region;
a seed layer formed on the substrate in a continuous region of the substrate including the first region and the second region; and
a light-receiving epitaxial layer formed on the seed layer in the first region and not formed in the second region,
wherein the seed layer is vertically between the insulator and the light-receiving epitaxial layer in the first region.

32. The semiconductor device of claim 31, wherein:
the light-receiving epitaxial layer is configured to receive light from a waveguide pattern of the semiconductor device.

33. The semiconductor device of claim 31, wherein:
the light-receiving epitaxial layer is configured to receive light applied directly from an optical fiber to the light-receiving epitaxial layer.

34. A photodetector, comprising:
a substrate;
a first insulation layer formed on the substrate in a first region of the photodetector;
a waveguide pattern formed on the first insulation layer in the first region;
a second insulation layer formed on the waveguide pattern in the first region;
a photon absorption seed layer including a first portion formed on and contacting the second insulation layer in the first region, a second portion formed on and contacting the substrate in a second region of the photodetector separate from the first region, a third portion extending between the first portion and the second portion, and a fourth portion formed in a trench in the substrate, wherein the first and second portions extend in a horizontal direction, the third portion extends in a vertical direction, and the trench is disposed beneath the third portion; and
a photon absorption layer formed on the photon absorption seed layer in the first region.

35. The photodetector of claim 34, further comprising:
an interlayer insulation layer contacting at least the photon absorption layer and the second and third portions of the photon absorption seed layer.

36. The photodetector of claim 34, wherein:
the third portion of the photon absorption seed layer contacts a side of the waveguide pattern.

* * * * *